(12) United States Patent
Wikstroem

(10) Patent No.: US 12,148,818 B2
(45) Date of Patent: Nov. 19, 2024

(54) POWER SEMICONDUCTOR DEVICE COMPRISING A THYRISTOR AND A BIPOLAR JUNCTION TRANSISTOR

(71) Applicant: Hitachi Energy Ltd, Zürich (CH)

(72) Inventor: Tobias Wikstroem, Egliswil (CH)

(73) Assignee: Hitachi Energy Ltd, Zürich (CH)

( * ) Notice: Subject to any disclaimer, the term of this patent is extended or adjusted under 35 U.S.C. 154(b) by 140 days.

(21) Appl. No.: 17/913,981

(22) PCT Filed: Mar. 9, 2021

(86) PCT No.: PCT/EP2021/055919
§ 371 (c)(1),
(2) Date: Sep. 23, 2022

(87) PCT Pub. No.: WO2021/197774
PCT Pub. Date: Oct. 7, 2021

(65) Prior Publication Data
US 2023/0118951 A1 Apr. 20, 2023

(30) Foreign Application Priority Data
Mar. 31, 2020 (EP) ..................... 20167336

(51) Int. Cl.
*H01L 29/74* (2006.01)
*H01L 29/745* (2006.01)
(52) U.S. Cl.
CPC ...... *H01L 29/7404* (2013.01); *H01L 29/7416* (2013.01); *H01L 29/745* (2013.01)

(58) Field of Classification Search
CPC ............. H01L 29/7404; H01L 29/7412; H01L 29/7416; H01L 29/87
See application file for complete search history.

(56) References Cited

U.S. PATENT DOCUMENTS

| 3,265,909 A | 8/1966 | Gentry |
| 5,304,823 A * | 4/1994 | Byatt ................. H01L 27/0248 257/E29.217 |
| 5,442,219 A | 8/1995 | Kato |

(Continued)

FOREIGN PATENT DOCUMENTS

| CN | 106847810 A | 6/2017 |
| EP | 0110777 A1 | 6/1984 |

(Continued)

*Primary Examiner* — Wasiul Haider
(74) *Attorney, Agent, or Firm* — Slater Matsil, LLP

(57) ABSTRACT

A power semiconductor device includes a semiconductor wafer, a thyristor structure, and a bipolar junction transistor. The thyristor structure includes a first emitter layer of a first conductivity type adjacent the first main side, a first base layer of a second conductivity type, a second base layer of the first conductivity type, a second emitter layer of the second conductivity type, a gate electrode, a first main electrode, and a second main electrode arranged. The bipolar junction transistor includes a base electrode electrically separated from the gate electrode, a third main electrode arranged on the first main side and a fourth main electrode arranged on the second main side. The first main electrode is electrically connected to the third main electrode and the second main electrode is electrically connected to the fourth main electrode.

20 Claims, 13 Drawing Sheets

(56) References Cited

U.S. PATENT DOCUMENTS

| | | | |
|---|---|---|---|
| 6,570,193 | B1 | 5/2003 | Koga et al. |
| 2013/0207157 | A1 | 8/2013 | Rahimo et al. |
| 2016/0284708 | A1 | 9/2016 | Lophitis et al. |
| 2017/0294435 | A1 | 10/2017 | Rahimo et al. |

FOREIGN PATENT DOCUMENTS

| | | | |
|---|---|---|---|
| EP | 0167440 | A1 | 1/1986 |
| JP | S59108353 | A | 6/1984 |
| JP | H05251690 | A | 9/1993 |
| JP | 3266281 | B2 | 3/2002 |
| JP | 2013543260 | A | 11/2013 |

* cited by examiner

POWER SEMICONDUCTOR DEVICE COMPRISING A THYRISTOR AND A BIPOLAR JUNCTION TRANSISTOR

CROSS-REFERENCE TO RELATED APPLICATIONS

This application is a national stage application of International Application No. PCT/EP2021/055919, filed on Mar. 9, 2021, which claims priority to European Patent Application No. 20167336.5, filed on Mar. 31, 2020, which applications are hereby incorporated herein by reference.

TECHNICAL FIELD

The present invention relates to power semiconductor device having a thyristor and a bipolar junction transistor.

BACKGROUND

In the field of power semiconductor devices there are known turn-off power semiconductor devices such as a gate turn-off thyristor (GTO), and a gate commutated thyristor (GCT), in particular an integrated gate commutated thyristor (IGCT). In a reverse conducting (RC) IGCT a freewheeling diode may be integrated in the device wafer.

From U.S. Pat. No. 5,304,823 A it is known a semiconductor integrated circuit which can have a high holding current without the penalty of a high gate current. Such a circuit includes a PNPN device and junction bipolar transistor in which a further doped region of the same conductivity type as the transistor collector region and more heavily doped than the collector region prevents the devices affecting each other. The junction bipolar transistor has a current gain of at least 10 and base-collector and base-emitter junctions with reverse breakdown voltages of at least 50 volts. A PN diode can also be used in the circuit.

From U.S. Pat. No. 5,442,219 A it is known a semiconductor device comprising a half-bridge circuit, one of the two arms or elements of which is a thyristor, and the other is a bipolar transistor. It is structured vertically as a single semiconductor chip with a primary conductor type cathode area of the thyristor and a primary conductor type collector area of the bipolar transistor shared as common areas. A first isolation area is formed between an intermediate layer of the thyristor and the above described common area. A second isolation area is formed in the first isolation area provided between the intermediate layer of the thyristor and the base area of the bipolar transistor. Because the upper and lower arms of the half-bridge are vertically structured, the circuit provides for excellent area efficiency, current amplification factor, and current capacity. No specific isolation layers are required to isolate the upper arm from the lower arm. The first and second isolation areas suppress leakage current generated by the formation of incidental npn and pnp structures.

From US 20130207157 A1 it is known a reverse-conducting power semiconductor device with a wafer having a first main side and a second main side parallel to the first main side. The device includes a plurality of diode cells and a plurality of IGCT cells, each IGCT cell including between the first and second main side: a first anode electrode, a first anode layer of a first conductivity type on the first anode electrode, a buffer layer of a second conductivity type on the first anode layer, a drift layer of the second conductivity type on the buffer layer, a base layer of the first conductivity type on the drift layer, a first cathode layer of a second conductivity type on the base layer, and a cathode electrode on the first cathode layer. A mixed part includes the second anode layers of the diode cells alternating with the first cathode layers of the IGCT cells.

From EP0110777 A1 it is known a semiconductor device comprising a first emitter region, a first inhibit base region adjacent to the first emitter region, a second main base region and a second emitter region. The first emitter region is divided into several primary regions which are electrically connected together through cathode contacts. The first base region is divided into several regions connected electrically together by inhibit gate contacts. The latter contacts are connected to the cathode contacts through a switch enabling a short circuit between the inhibit gate and the cathode to be created so as to inhibit the self-firing capability of the thyristor. The thickness and doping of the base and emitter regions are chosen so that the thyristor is self-firing at normal ambient temperatures through the capacitive current alone when the alternating supply voltage falls to zero.

As an example for a known turn-off power semiconductor device a prior art RC-IGCT 1 is shown in FIGS. 1A and 1B. Such RC-IGCT is described, for example, in WO 2012/041958 A2. FIG. 1A illustrates a portion of the known RC-IGCT 1 in cross section and FIG. 1B shows the layout of the device in top view. The RC-IGCT 1 comprises a plurality of thyristor cells 2 and an integrated free-wheeling diode 3. All thyristor cells 2 and the integrated free-wheeling diode 3 are formed in one single wafer 10 having a first main side 11, which is the cathode side of the RC-IGCT 1, and a second main side 12, which is the anode side of the RC-IGCT 1.

As can be seen in FIG. 1A, each thyristor cell 2 comprises from the first main side 11 to the second main side 12 of the wafer 10 a first cathode electrode 21, an $n^+$-doped cathode semiconductor layer portion 22, a p-doped base semiconductor layer 23, an $n^-$-doped drift semiconductor layer 24, an n-doped buffer semiconductor layer 25, a $p^+$-doped first anode semiconductor layer 26 and a first anode electrode 27. The cathode semiconductor layer portions 22 of the plurality of thyristor cells 2 form a first cathode semiconductor layer. Therein the buffer semiconductor layer 25 has a rising doping concentration towards the second main side 12, whereas the drift semiconductor layer 24 has typically a constant doping concentration.

Further, each thyristor cell 2 has a gate electrode 20 which is arranged on the first main side 11 of the wafer 10 lateral to the cathode semiconductor layer portion 22 and contacting the base semiconductor layer 23, but separated from the first cathode electrode 21 and the cathode semiconductor layer portion 22. Therein, the term "lateral" relates to the position in a lateral direction which is a direction parallel to the first main side 11.

In the circumferential edge region of the wafer 10 there is arranged the integrated single free-wheeling diode 3, a cross section of which along the line AA' in FIG. 1B can also be seen in FIG. 1A. The free-wheeling diode 3 comprises from the first main side 11 to the second main side 12 of the wafer 10 a second anode electrode 31, a p-doped second anode semiconductor layer 32, an $n^+$-doped second cathode semiconductor layer 33, which is separated from the p-doped second anode semiconductor layer 32 by the $n^-$-doped drift semiconductor layer 24, and a second cathode electrode 34.

The arrangement of the plurality of thyristor cells 2 in the RC-IGCT 1 is illustrated in FIG. 1B which shows a top view onto the first main side 11 of the wafer. The cathode semiconductor layer portions 22 of the RC-IGCT 1 are formed in the shape of strips with its longitudinal direction aligned in a radial direction which is a direction extending from a lateral center of the circular wafer 10 and being parallel to the first main side 11 of the wafer 10. Further, strips shall be understood as layers, which have in one direction, which is their longitudinal direction, a longer extension than in the other directions by having two longer sides, which are typically arranged parallel to each other. The plurality of strip-shaped cathode semiconductor layer portions 22 are arranged in concentric rings around the center of the device. In the center region of the wafer 10 there is arranged a common gate contact 40 to which all gate electrodes 20 of the plurality of thyristor cells 2 are electrically connected. The gate electrodes 20 of the thyristor cells 2, the common gate contact 40 and the connections there between are implemented as a gate metallization layer surrounding all the cathode semiconductor layer portions 22.

For turning off the RC-IGCT, a short control gate current pulse is supplied through the common gate contact 40 to the gate electrodes 20 of the plurality of thyristor cells 2.

IGCTs latch into the on-state, which means that they do not actively control the anode voltage at turn-on. While this is advantageous in terms of its own losses, it is problematic for free-wheeling diodes. With high reverse voltage and reverse current at the same time in the freewheeling diode, the losses in the freewheeling diode during reverse recovery are relatively high. In order to protect the accompanying diode, a dI/dt limiting inductor, a choke, is always included in prior art IGCT circuits. The choke causes problems with over-voltage, requiring another protective circuit—the over-voltage clamp—when using IGCTs. The clamp circuit consists of a clamp capacitor, a diode and a resistor.

All protective circuit elements are costly to procure and assemble. The additional cost disadvantages and relatively high diode losses during turn-on in the IGCT limit the inherent loss advantage of the IGCT over an insulated gate bipolar transistor (IGBT).

SUMMARY

In view of the above, embodiments of the invention provide a power semiconductor device comprising a thyristor structure that can avoid the above disadvantages of the IGCT. For example, embodiments of the invention provide a power semiconductor device with reduced system losses and less need for protective circuits.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF ILLUSTRATIVE EMBODIMENTS

Figure 1A:
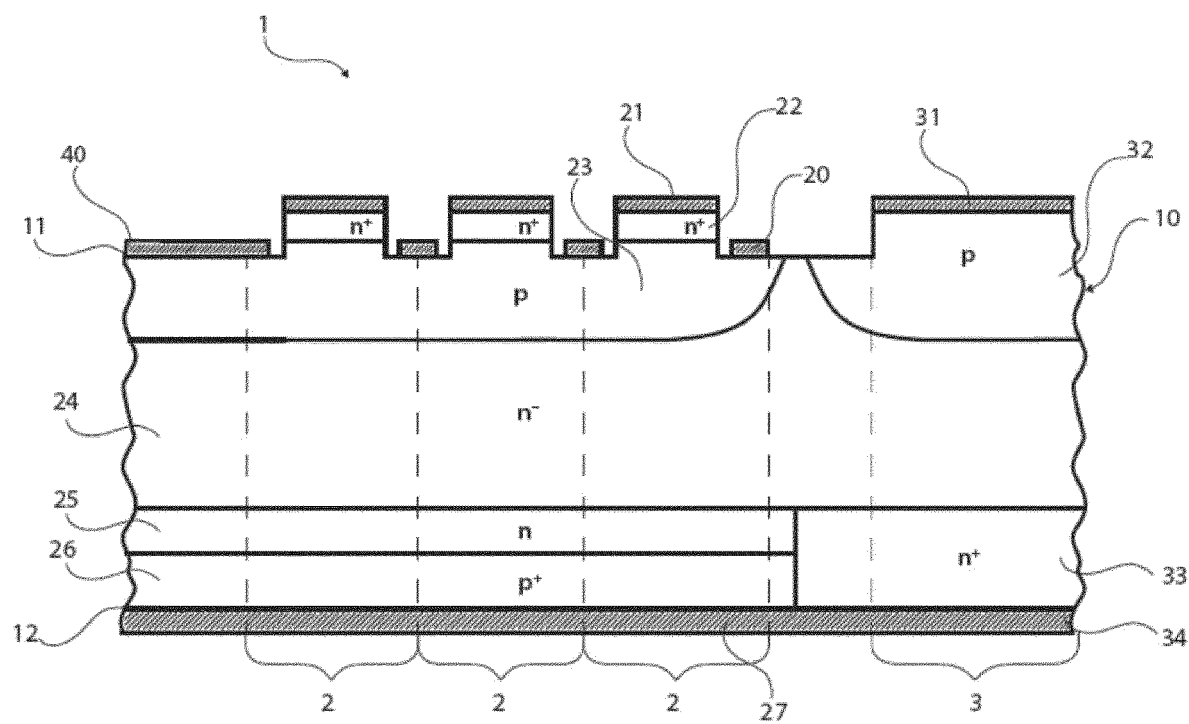
FIG. 1A is a cross section of a portion of a turn-off power semiconductor device known from the prior art along a line AA' in FIG. 1B.
Figure 1B:
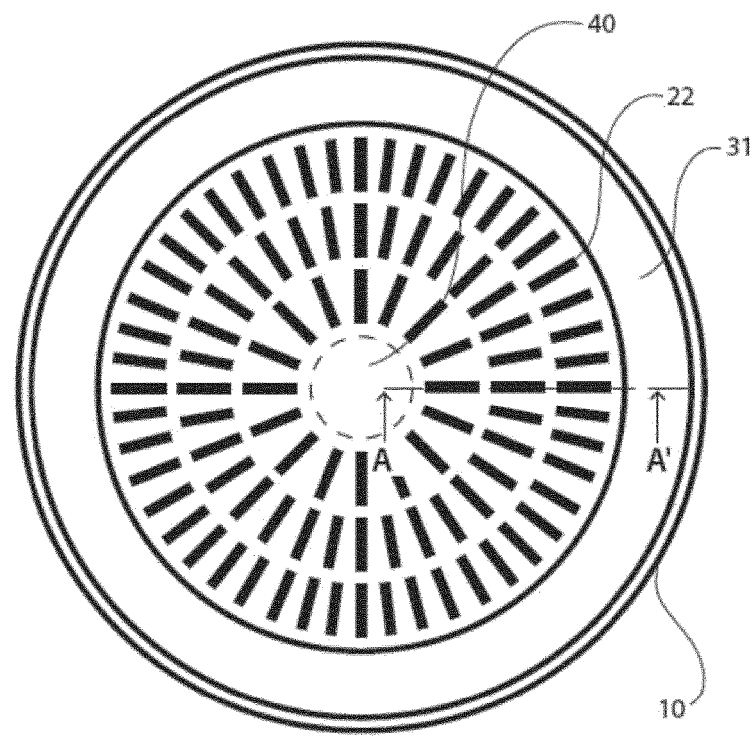
FIG. 1B is a top view of the turn-off power semiconductor device shown in FIG. 1A.

As shown in the figures, in various embodiments, a power semiconductor device comprises a semiconductor wafer 110; 210; 210'; 210"; 310 having a first main side 111; 211; 311 and a second main side 112; 212; 312 opposite to the first main side 111; 211; 311, a thyristor structure 50; 50'; 50" and a bipolar junction transistor arranged lateral to the thyristor structure 50; 50'; 50". The thyristor structure 50; 50'; 50" comprises in an order from the first main side to the second main side: first emitter layer 154 of a first conductivity type, a first base layer 155 of a second conductivity type different from the first conductivity type, second base layer 159 of the first conductivity type, and a second emitter layer 158 of the second conductivity type separated from the first base layer 155 by the second base layer 159. The first emitter layer 154 is in direct contact with the first base layer 155 to form a first p-n junction between the first base layer 155 and the first emitter layer 154. The first base layer 155 is in direct contact with the second base layer 159 to form a second p-n junction between the first base layer 155 the second base layer 159. The second base layer 159 is in direct contact with the second emitter layer 158 to form a third p-n junction between the second base layer 159 and the second emitter layer 158.

The thyristor structure so; 50; 50'; 50" further comprises a gate electrode 161 which is arranged lateral to the first emitter layer 154 and forms an ohmic contact with the first base layer 155, a first main electrode 162 which is arranged on the first main side and forms an ohmic contact with the first emitter layer 154, and a second main electrode 163 which is arranged on the second main side and forms an ohmic contact with the second emitter layer 158.

The bipolar junction transistor comprises a base electrode 171 electrically separated from the gate electrode 161, a third main electrode 172 arranged on the first main side and a fourth main electrode 173 arranged on the second main side. The base electrode 171 corresponds to a base terminal of the bipolar junction transistor. The third main electrode 172 corresponds to one of a collector terminal and an emitter terminal of the bipolar junction transistor, and the fourth main electrode 173 corresponds to the other one of the collector terminal and the emitter terminal of the bipolar junction transistor. The first main electrode 162 is electrically connected to the third main electrode 172, and the second main electrode 163 is electrically connected to the fourth main electrode 173.

Throughout the specification, a lateral direction shall be understood as a direction parallel to the second main side. In case of an uneven second main side, a lateral direction parallel to the second main side is to be understood as a direction parallel to a reference plane for which the arithmetic mean value of a distance between the second main side and the reference plane is minimal (compared to all other planes), wherein the arithmetic mean value is calculated from the distance values of all points on the second main side. Throughout the specification the term lateral shall refer to such defined lateral direction. Exemplarily, if one element is described to be arranged lateral to another element, then it is arranged at a position which is shifted from the position of the other element in the lateral direction as defined above.

The bipolar junction transistor integrated in the semiconductor wafer allows to control and modulate a voltage between third main electrode 172 and the fourth main electrode 173 by controlling a voltage applied to the base electrode 171. This allows to turn-on first the bipolar junction transistor and subsequently the thyristor structure 50; 50'; 50" in a controlled manner without need for the usual protection circuits (choke and clamp) as described below in more detail. By connecting the first main electrode 162 to the third main electrode 172 and the second main electrode 163 to the fourth main electrode 173, a modulation of the voltage between third main electrode 172 and the fourth main electrode 173 is efficiently coupled to a voltage between the first main electrode 162 and the second main electrode 163 to thereby allow to modulate the voltage between the first main electrode 162 and the second main electrode 163 by control of the bipolar junction transistor.

In an exemplary embodiment, the semiconductor wafer comprises a separation region 80 of the first conductivity type, wherein the separation region 80 is arranged laterally between the bipolar junction transistor and the thyristor structure 50; 50'; 50" to separate the bipolar junction transistor from the thyristor structure 50; 50'; 50" by at least the separation region 80. The separation region 80 electrically decouples the bipolar junction transistor from the thyristor structure 50; 50'; 50". This allows independent control of the bipolar junction transistor and of the thyristor structure 50; 50'; 50".

In an exemplary embodiment, the semiconductor wafer comprises a freewheeling diode 90 arranged lateral to the thyristor structure 50; 50'; 50" and arranged lateral to the bipolar junction transistor, the freewheeling diode 90 comprising in an order from the first main side to the second main side a first diode layer 191 of the second conductivity type and a second diode layer 192 of the first conductivity type forming a fourth p-n junction with the first diode layer 191. With the freewheeling diode 90 the power semiconductor device is a reverse conducting (RC) power semiconductor device. The bipolar junction transistor allows to reduce losses during reverse of the freewheeling diode 90 when the thyristor structure 50; 50'; 50" is turned on.

In an exemplary embodiment, the second base layer 159 comprises a relatively low doped thyristor drift layer portion and a thyristor buffer layer portion having a doping concentration higher than that of the thyristor drift layer portion, wherein the thyristor buffer layer portion separates the thyristor drift layer portion from the second emitter layer 158. An asymmetric design of the second base layer 159 comprising the thyristor drift layer portion and the thyristor buffer layer portion allows to reduce the layer thickness of the second base layer 159 and thereby significantly reduce on-state losses in the thyristor structure 50; 50'; 50".

In an exemplary embodiment, the thyristor structure 50; 50'; 50" comprises a gate commutated thyristor (GCT) device comprising a plurality of thyristor cells. In this exemplary embodiment, each thyristor cell may comprise a portion of the first emitter layer 154, a portion of the first base layer 155, a portion of the second base layer 159, a portion of the second emitter layer 158 separated from the portion of the first base layer 155 by the portion of the second base layer 159. The portion of the first emitter layer 154 is in direct contact with the portion of the first base layer 155 to form a portion of the first p-n junction between the first base layer 155 and the first emitter layer 154, the portion of the first base layer 155 is in direct contact with the second base layer 159 to form a portion of the second p-n junction between the first base layer 155 and the second base layer 159, and the portion of the second base layer 159 is in direct contact with the portion of the second emitter layer 158 to form a portion of the third p-n junction between the second base layer 159 and the second emitter layer 158.

In this exemplary embodiment, the thyristor structure 50; 50'; 50" may further comprise a portion of the gate electrode 161 which is arranged lateral to the portion of the first emitter layer 154 and forms an ohmic contact with the portion of the first base layer 155, a portion of the first main electrode 162 which forms an ohmic contact with the portion 154a, 154b of the first emitter layer 154 a portion of the second main electrode 163 which forms an ohmic contact with the portion of the second emitter layer 158.

Therein, the portion of the first emitter layer 154 of each thyristor cell may be laterally separated from the portion of the first emitter layer 154 of each other thyristor cell.

With the plurality of thyristor cells it is possible to realize an integrated gate commutated thyristor (IGCT) which in the prior art requires the use of extensive protection circuits due to the fast turn-on. This extensive protection circuits mitigate the advantages of lower intrinsic losses compared to, e.g., an IGBT. With the integrated bipolar junction transistor it is possible to avoid the need for protection circuits and exploit the potential of the IGCT regarding low intrinsic losses more efficiently.

In an exemplary embodiment, the bipolar junction transistor comprises in an order from the first main side to the second main side a third emitter layer 184 of the first conductivity type, a third base layer 185 of the second conductivity type which is connected to the third emitter layer 184 through a fourth p-n junction, a transistor drift layer portion of the first conductivity type which is connected to the third base layer 185 through a fifth p-n junction, and a collector layer 188 of the first conductivity type which has a higher doping concentration than the transistor drift layer portion and is either in direct contact with the transistor drift layer portion or is connected to the transistor drift layer portion by a transistor buffer layer portion of the first conductivity type.

Therein, the transistor buffer layer portion has a doping concentration higher than that of the transistor drift layer portion. Exemplarily, the transistor buffer layer portion may have a rising doping concentration towards the second main side, whereas the transistor drift layer portion may have a constant doping concentration. The doping concentration of the buffer layer portion may be lower than that of the collector layer 188.

In this exemplary embodiment, the third main electrode 172 forms an ohmic contact with the third emitter layer 184, the fourth main electrode 173 forms an ohmic contact with the collector layer 188, and the base electrode 171 is arranged lateral to the third emitter layer 184 and forms an ohmic contact with the third base layer 185.

This specific configuration of the bipolar junction transistor allows to use only the existing profiles and to have the gate electrode 161 and the base electrode 171 on the same side of the device, namely on the first main side.

In this exemplary embodiment, a depth of the first base layer 155, to which depth the first base layer 155 extends from the first main side, may be the same as a depth of the third base layer 185, to which depth the third base layer 185 extends from the first main side. Also, in this exemplary embodiment, the first base layer 155 may have, at a first lateral position at which a lateral gradient of a doping concentration of the first base layer 155 is zero for all vertical positions, the same vertical doping concentration profile as the third base layer 185 at a second lateral position at which a lateral gradient of a doping concentration of the third base layer 185 is zero for all vertical positions. Such similar depth and/or doping profile allows to form the first base layer 155 and the third base layer 185 in the same manufacturing step to thereby facilitate manufacture of the power semiconductor device.

In an exemplary embodiment, a ratio between a bipolar junction transistor area and a thyristor area is in a range between 0.1 and 0.3, or in a range between 0.15 and 0.25, where the thyristor area is defined as an area occupied by the first base layer 155 of the thyristor structure 50; 50'; 50" in a horizontal projection onto a plane parallel to the second main side and wherein the bipolar junction transistor area is defined as an area occupied by the third base layer 185 in the horizontal projection onto the plane parallel to the second main side.

Such ratio between the bipolar junction transistor area and the thyristor area results in improved thermal management and best thermal properties of the power semiconductor device during both, during thyristor structure 50; 50'; 50" action and during bipolar junction transistor action of the power semiconductor device.

In an exemplary embodiment, the bipolar junction transistor comprises:
a collector layer 188 of the second conductivity type arranged adjacent to the first main side, a third base layer 185 of the first conductivity type arranged adjacent to the second main side, a third emitter layer 184 of the second conductivity type arranged adjacent to the second main side lateral to the third base layer 185, and a transistor drift layer portion arranged between the collector layer 188 and each one of the third base layer 185 and the third emitter layer 184.

Therein, the collector layer 188 is connected to the transistor drift layer portion through a fourth p-n junction, the third base layer 185 is either in direct contact with the transistor drift layer or is connected to the transistor drift layer portion through a transistor buffer layer portion of the first conductivity type, the third base layer 185 is connected to the third emitter layer 184 through a fifth p-n junction, the third main electrode 172 forms an ohmic contact with the collector layer 188, the fourth main electrode 173 forms an ohmic contact with the third emitter layer 184, and the base electrode 171 is arranged lateral to the fourth main electrode 173 and forms an ohmic contact with the third base layer 185. Therein, the transistor buffer layer portion has a doping concentration higher than that of the transistor drift layer portion. Exemplarily, the transistor buffer layer portion may have a rising doping concentration towards the second main side, whereas the transistor drift layer portion may have a constant doping concentration. The doping concentration of the transistor buffer layer portion may be lower than that of the collector layer 188.

In such exemplary embodiment the bipolar junction transistor has a very wide base, with poor current amplification as a result. This is advantageous since the goal is to moderate the voltage which is facilitated with low current amplification.

A depth of the first base layer 155 to which the first base layer 155 extends from the first main side may be the same as a depth of the collector layer 188 to which the collector layer 188 extends from the first main side. In such configuration the first base layer 155 and the collector layer 188 may be manufactured simultaneously facilitating manufacturing of the power semiconductor device.

A depth of the second emitter layer 158 to which the second emitter layer 158 extends from the second main side may be the same as a depth of the third emitter layer 184 to which the third emitter layer 184 extends from the second main side. In such configuration the second emitter layer 158 and the third emitter layer 184 may be manufactured simultaneously facilitating manufacturing of the power semiconductor device.

In an exemplary embodiment, the power semiconductor device comprises a first control unit electrically connected to the gate electrode 161 and configured to control a voltage and/or current applied to the gate electrode 161; and a second control unit electrically configured to control a current and/or voltage applied to the base electrode 171. The first control unit and the second control unit are configured to first turn on the bipolar junction transistor in a state in which the thyristor structure 50; 50'; 50" is in a forward blocking state, to thereafter turn on the thyristor structure 50; 50'; 50" from the forward blocking state into the forward conducting state, and to thereafter turn off the bipolar junction transistor while maintaining the thyristor structure 50; 50'; 50" in the forward conducting state.

The individual control of the voltage and/or current applied to the gate electrode 161 and to the base electrode 171 facilitates turn-on of the thyristor structure 50; 50'; 50" without need for additional protection circuit.

Figure 2A:
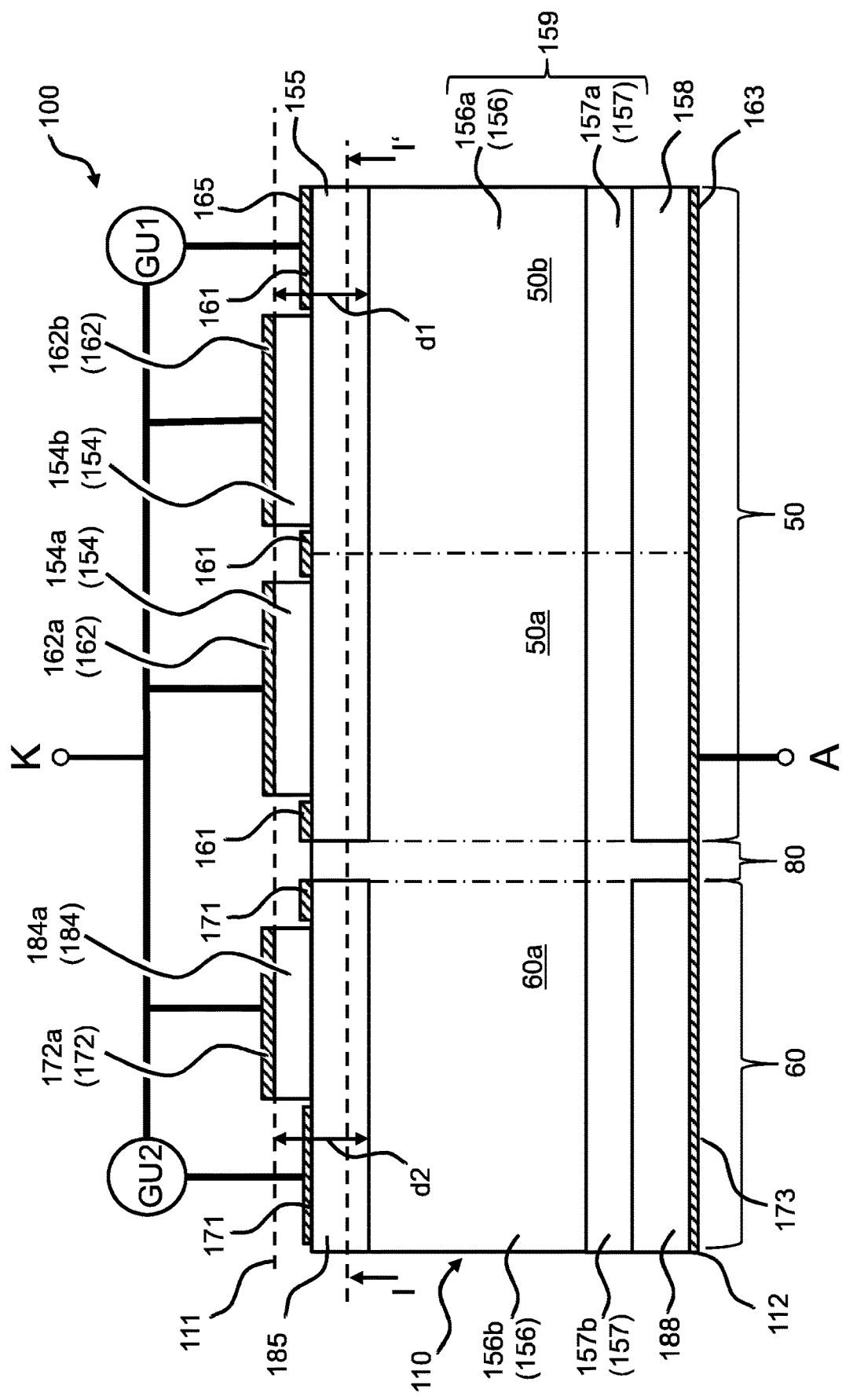
FIG. 2A illustrates a power semiconductor device according to a first embodiment in vertical cross-section.
Figure 2B:
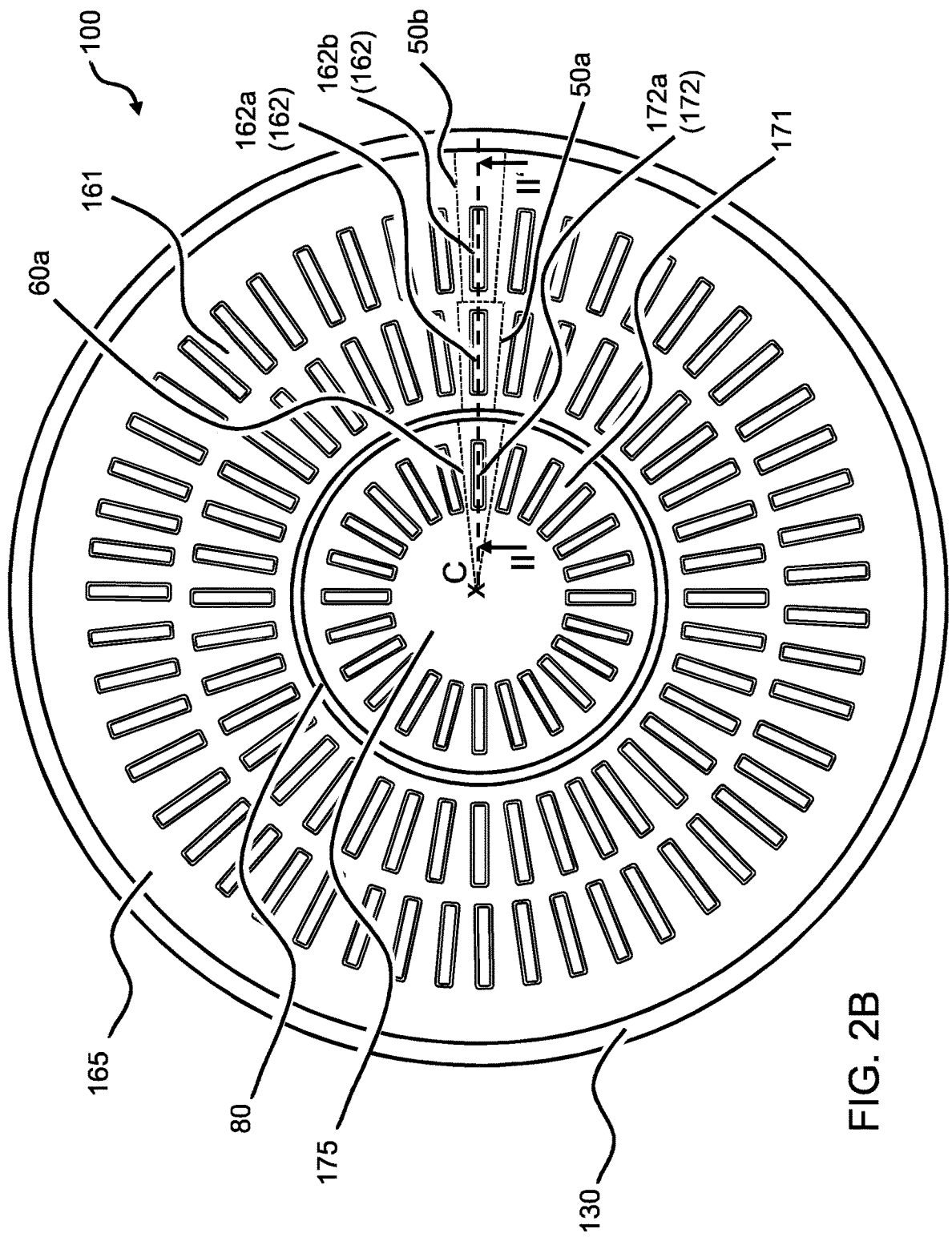
FIG. 2B shows a top view of the power semiconductor device according to the first embodiment.
Figure 2C:
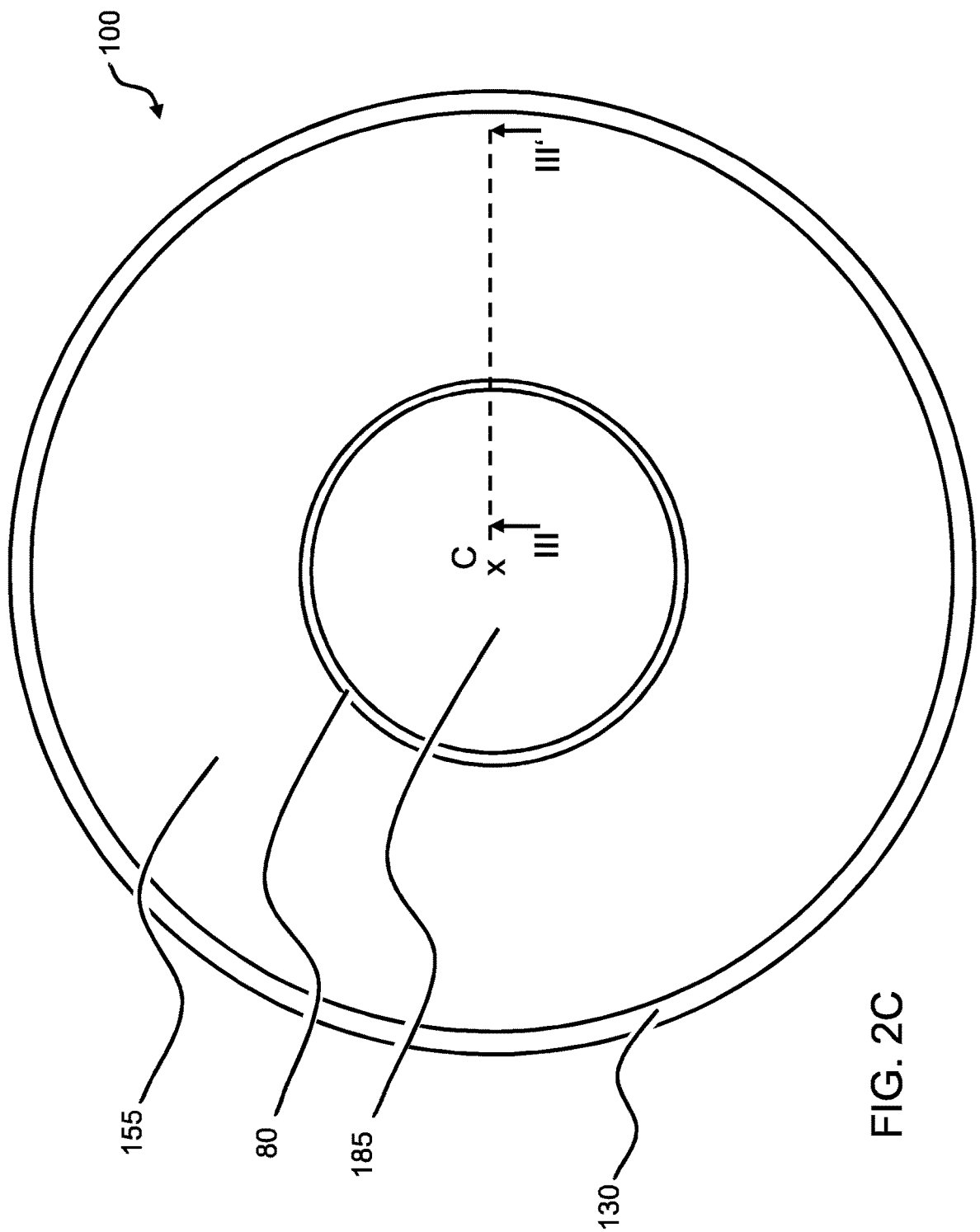
FIG. 2C shows a horizontal cross-section of the power semiconductor device according to the first embodiment.

In the following a power semiconductor device 100 according to a first embodiment is described with reference to FIGS. 2A, 2B and 2C. FIG. 2A illustrates the power semiconductor device 100 in vertical cross-section along a line II-II' in FIG. 2B, which shows the power semiconductor 100 in top view, and along a line III-III' in FIG. 2C, which shows a horizontal cross-section of the power semiconductor device 100 along a line I-I' in FIG. 2A.

The power semiconductor device 100 comprises a semiconductor wafer no having a first main side 111 and a second main side 112 opposite to the first main side 111. Integrated in the semiconductor wafer 110 is a thyristor structure 50 and a bipolar junction transistor (BJT) 60, which are laterally separated from each other by an n-type separation region 80.

Throughout the specification the first main side 111 and the second main side 112 of the semiconductor wafer 110 shall respectively be understood as a plane including the outermost flat surface portions of the semiconductor wafer 110 on two opposite sides.

The thyristor structure 50 comprises in an order from the first main side 111 to the second main side 112 an n-type first emitter layer 154, a p-type first base layer 155, a n-type second base layer 159 and a p-type second emitter layer 158. The first emitter layer 154 is in direct contact with the first base layer 155 to form a first p-n junction between the first base layer 155 and the first emitter layer 154, the first base layer 155 is in direct contact with the second base layer 159 to form a second p-n junction between the first base layer 155 and the second base layer 159, and the second base layer 159 is in direct contact with the second emitter layer 158 to form a third p-n junction between the second base layer 159 and the second emitter layer 158. The second emitter layer 158 is separated from the first base layer 155 by the second base layer 159.

The second base layer 159 comprises in an order from the first base layer 155 to the second emitter layer 158 a thyristor drift layer portion 156a and a thyristor buffer layer portion 157a. The thyristor drift layer portion 156a is in direct contact with the first base layer 155 and the thyristor buffer layer portion 157a is in direct contact with the second emitter layer 158. Therein, the thyristor buffer layer portion 157a is vertically separated from the first base layer 155 by the thyristor drift layer portion 156a. The thyristor structure 50 further comprises a gate electrode 161, a first main electrode 162 and a second main electrode 163. The gate electrode 161 is arranged lateral to the first emitter layer 154 and forms an ohmic contact with the first base layer 155, the first main electrode 162 is arranged on the first main side 111 and forms an ohmic contact with the first emitter layer 154, and a second main electrode 163 is arranged on the second main side 112 and forms an ohmic contact with the second emitter layer 158.

The BJT 60 is arranged lateral to the thyristor structure 50. It comprises a base electrode 171 electrically separated from the gate electrode 161, a third main electrode 172 arranged on the first main side 111 and a fourth main electrode 173 arranged on the second main side 112. The base electrode 171 corresponds to a base terminal of the BJT 60, the third main electrode 172 corresponds to one of a collector terminal and an emitter terminal of the BJT 60, and the fourth main electrode 173 corresponds to the other one of the collector terminal and the emitter terminal of the BJT 60. The BJT 60 comprises in an order from the first main side 111 to the second main side 112 an n-type third emitter layer 184, a p-type third base layer 185, an n-type transistor drift layer portion 156b, an n-type transistor buffer layer portion 157b and an n-type collector layer 188. The third base layer 185 is connected to the third emitter layer 184 to form a fourth p-n junction, the transistor drift layer portion 156b is connected to the third base layer 185 to form a fifth p-n junction, and the collector layer 188 is separated in a vertical direction (which is a direction extending from the first main side towards the second main side) from the transistor drift layer portion 156b by the transistor buffer layer portion 157b, i.e. the collector layer 188 is connected to the transistor drift layer 156b through the transistor buffer layer portion 157b.

In the first embodiment as shown in FIG. 2A, a drift layer 156 and a buffer layer 157 extend in the power semiconductor device 100 laterally throughout the whole semiconductor wafer 110. Accordingly, the drift layer 156 and the buffer layer 157 are shared by the thyristor structure 50, the BJT 60 and the separation region 80. The thyristor drift layer portion 156a is a first portion of the drift layer 156, and the transistor drift layer portion 156b is a second portion of the drift layer 156. Likewise, the thyristor buffer layer portion 157a is a first portion of the buffer layer 157, and the transistor buffer layer portion 157b is a second portion of the buffer layer 157. A third portion of the drift layer 156 forms part of the separation region 80 and separates the thyristor drift layer portion 156a from the transistor drift layer portion 156b in a lateral direction. Likewise, a third portion of the buffer layer forms part of the separation region 80 and separates the thyristor buffer layer portion 157a from the transistor buffer layer portion 157b in a lateral direction.

The collector layer 188 and the buffer layer 157 both have a higher doping concentration than the drift layer 156. Therein, the buffer layer 157 may have a rising doping concentration towards the second main side 112, whereas the drift layer 156 has typically a constant doping concentration lower than that of the buffer layer 157. Throughout this specification, the term doping concentration refers to the net doping concentration. Further, throughout this specification the doping concentration of a layer refers to a local doping concentration in case that a doping profile of this layer is described. If no doping profile is described, the doping concentration of a layer refers to the maximum doping concentration in this layer unless indicated otherwise.

The third main electrode 172 forms an ohmic contact with the third emitter layer 184, the fourth main electrode 173 forms an ohmic contact with the collector layer 188, and the base electrode 171 is arranged lateral to the third emitter layer 184 and forms an ohmic contact with the third base layer 185.

The thyristor structure 50 comprises a gate commutated thyristor (GCT) device comprising a plurality of thyristor cells 50a and 50b. In the first embodiment each thyristor cell 50a, 50b comprises a portion 154a, 154b of the first emitter layer 154, a portion of the first base layer 155, wherein the portion 154a, 154b of the first emitter layer 154 is in direct contact with the portion of the first base layer 155 to form a portion of the first p-n junction between the first base layer 155 and the first emitter layer 154, a portion of the second base layer 159, wherein the portion of the first base layer 155 is in direct contact with the portion of the second base layer 159 to form a portion of the second p-n junction between the first base layer 155 and the second base layer 159, and a portion of the second emitter layer 158 vertically separated from the portion of the first base layer 155 by the portion of the second base layer 159, wherein the portion of the second base layer 159 is in direct contact with the portion of the second emitter layer 158 to form a portion of the third p-n junction between the second base layer 159 and the second emitter layer 158.

The thyristor structure 50 further comprises a portion of the gate electrode 161 which is arranged lateral to the portion 154a, 154b of the first emitter layer 154 and forms an ohmic contact with the portion of the first base layer 155, a portion 162a, 162b of the first main electrode 162 which forms an ohmic contact with the portion 154a, 154b of the first emitter layer 154, and a portion of the second main electrode 163 which forms an ohmic contact with the portion of the second emitter layer 158. The portion 154a, 154b of the first emitter layer 154 of each thyristor cell 50a, 50b is laterally separated from the portion 154a, 154b of the first emitter layer 154 of each other thyristor cell 50a, 50b. As can be seen best from the top view in FIG. 2B the portions 154a, 154b of the first emitter layer 154 are strip-shaped and arranged in two rings around a lateral center C of the circular semiconductor wafer 110. A longitudinal main axis of each strip-shaped portion 154a, 154b of the first emitter layer 154 is aligned along a radial direction extending from the lateral center C towards a circumferential edge region 130 of the semiconductor wafer 110. Therein, the longitudinal main axis of each strip-shaped portion 154a, 154b of the first emitter layer 154 is defined as an axis extending in the direction in which the strip-shaped portion 154a, 154b has its largest width. In the top view shown in FIG. 2B each strip-shaped portion 154a, 154b of the first emitter layer 154 and a corresponding strip-shaped portion 162a, 162b on top of the strip-shaped portion 154a, 154b is laterally surrounded by the gate electrode 161 implemented as continuous metallization layer. On a lateral outer edge of the thyristor structure 50 the gate electrode 161 comprises a ring-shaped first common gate contact area 165 for connecting the gate electrode 161 to a later described first control unit GU1 as schematically shown in FIG. 2A.

Like the thyristor structure 50 also the BJT 60 has a cell structure with a plurality of BJT cells 60a wherein all of the plurality of BJT cells 60a have a same basic structure. FIG. 2A shows one of the plurality of BJT cells 60a in cross-section. In FIG. 2B this BJT cell 60a is indicated by a dashed line. As shown in FIGS. 2A and 2B, each BJT cell 60a comprises a portion of the base electrode 171, a strip-shaped portion 172a of the third main electrode 172 and a portion of the fourth main electrode 173. The portion of the base electrode 171 corresponds to a base terminal of the BJT cell 60a, the portion 172a of the third main electrode 172 corresponds to one of a collector terminal and an emitter terminal of the BJT cell 60a, and the portion of the fourth main electrode 173 corresponds to the other one of the collector terminal and the emitter terminal of the BJT cell 60a. The BJT cell 60a further comprises in an order from the first main side 111 to the second main side 112 a strip-shaped portion 184a of the third emitter layer 184, a portion of the third base layer 185, a portion of the transistor drift layer portion 156b, a portion of the transistor buffer layer portion 157b and a portion of the collector layer 188. The portion of the third base layer 185 is connected to the portion of the third emitter layer 184 to form a portion of the fourth p-n junction, the portion of the transistor drift layer portion 156b is connected to the portion of the third base layer 185 to form a portion of the fifth p-n junction, and the portion of the collector layer 188 is separated in a vertical direction (which is a direction extending from the first main side towards the second main side) from the portion of the transistor drift layer portion 156b by the portion of the transistor buffer layer portion 157b, i.e. the portion of the collector layer 188 is connected to the portion of the transistor drift layer portion 156b through the portion of the transistor buffer layer portion 157b. In a lateral center portion of, the base electrode 162 comprises a circular shaped second common gate contact area 175 for connecting the base electrode 171 to a later described second control unit GU1 as schematically shown in FIG. 2A.

A depth d1 of the first base layer 155, to which depth d1 the first base layer 155 extends from the first main side 111 (i.e. the depth d1 of the first base layer 155 is to be understood as a maximum distance between the first main side 111 and a point within the first base layer 155) is the same as a depth d2 of the third base layer 185, to which depth d2 the third base layer 185 extends from the first main side 111 (i.e. the depth d2 of the third base layer 185 is to be understood as a maximum distance between the first main side 111 and a point within the third base layer 185).

Also, the first base layer 155 may have, at a first lateral position at which a lateral gradient of a doping concentration of the first base layer 155 is zero for all vertical positions, the same vertical doping concentration profile as the third base layer 185 at a second lateral position at which a lateral gradient of a doping concentration of the third base layer 185 is zero for all vertical positions.

A ratio between a BJT area and a thyristor area may be in a range between 0.1 and 0.3, or in a range between 0.15 and 0.25, wherein the thyristor area is defined as an area occupied by the first base layers 155 of the thyristor structure 50 in a horizontal projection onto a plane parallel to the second main side 112 and wherein the BJT area is defined as an area occupied by the third base layer 185 in the horizontal projection onto the plane parallel to the second main side 112.

As schematically shown in FIG. 2A the first main electrode 162 is electrically connected to the third main electrode 172 and the second main electrode 163 is electrically connected to the fourth main electrode 173. Specifically, the first main electrode 162 and the second main electrode 163 are both electrically connected to a cathode terminal K of the power semiconductor device 100, and the second main electrode 163 and the fourth main electrode 173 are both electrically connected to an anode terminal A of the power semiconductor device 100.

The first control unit GU1, which is electrically connected to the gate electrode 161, is configured to control a voltage and/or current applied to the gate electrode 161, while the second control unit GU2, which is electrically connected to the base electrode 171, is electrically configured to control a current and/or voltage applied to the base electrode 171.

The first control unit GU1 and the second control unit GU2 are configured to first turn on the BJT 60 in a state in which the thyristor structure 50 is in a forward blocking state, to thereafter turn on the thyristor structure 50 from the forward blocking state into the forward conducting state, and to thereafter turn off the bipolar junction transistor 60 while maintaining the thyristor structure 50 in the forward conducting state. With such control of the thyristor structure 50 and of the BJT 60 turn-on of the thyristor structure 50 can be performed in a safe manner without using additional protection circuits.

Figure 3A:
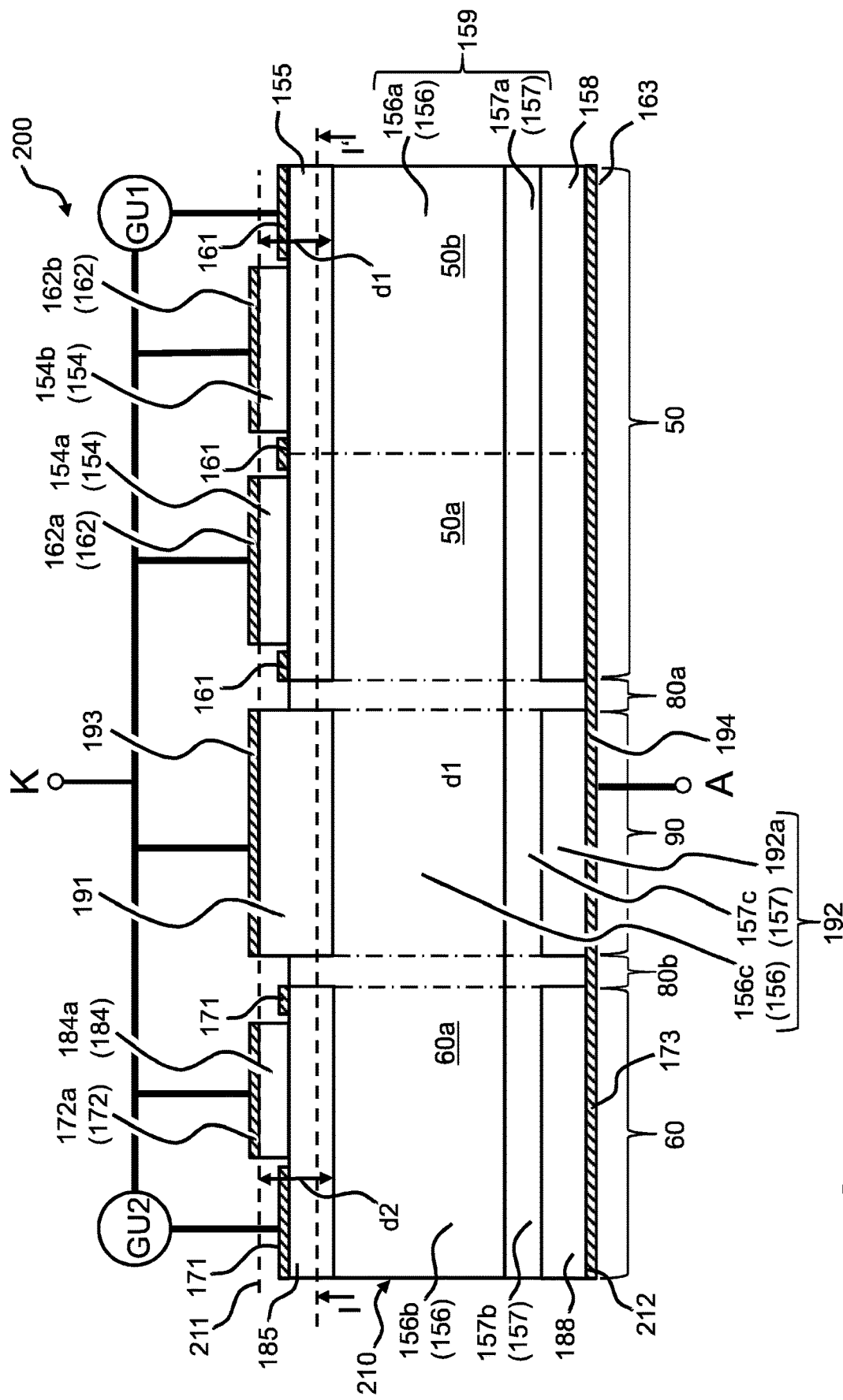
FIG. 3A illustrates a power semiconductor device according to a second embodiment in vertical cross-section.
Figure 3B:
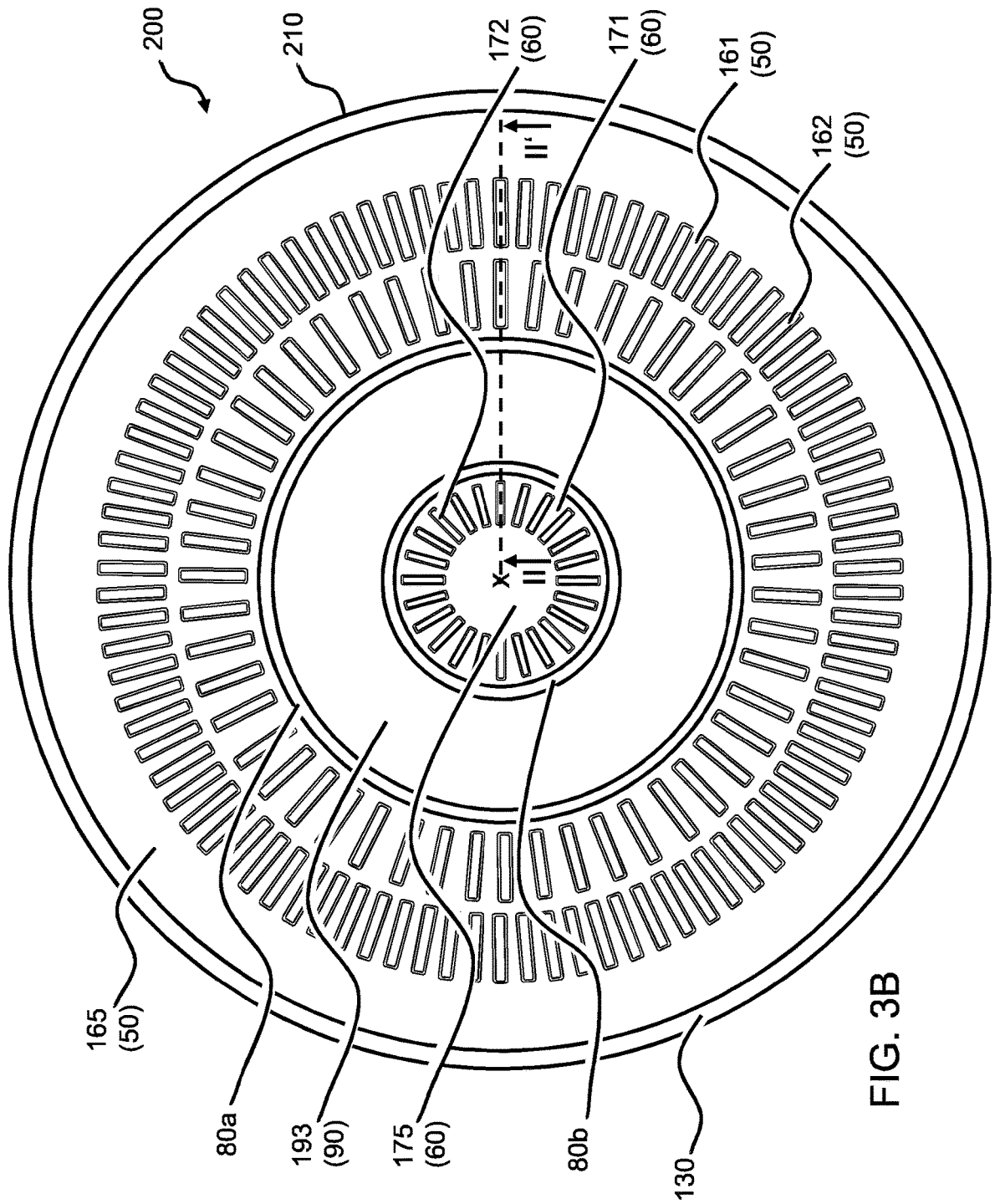
FIG. 3B shows a top view of the power semiconductor device according to the second embodiment.
Figure 3C:
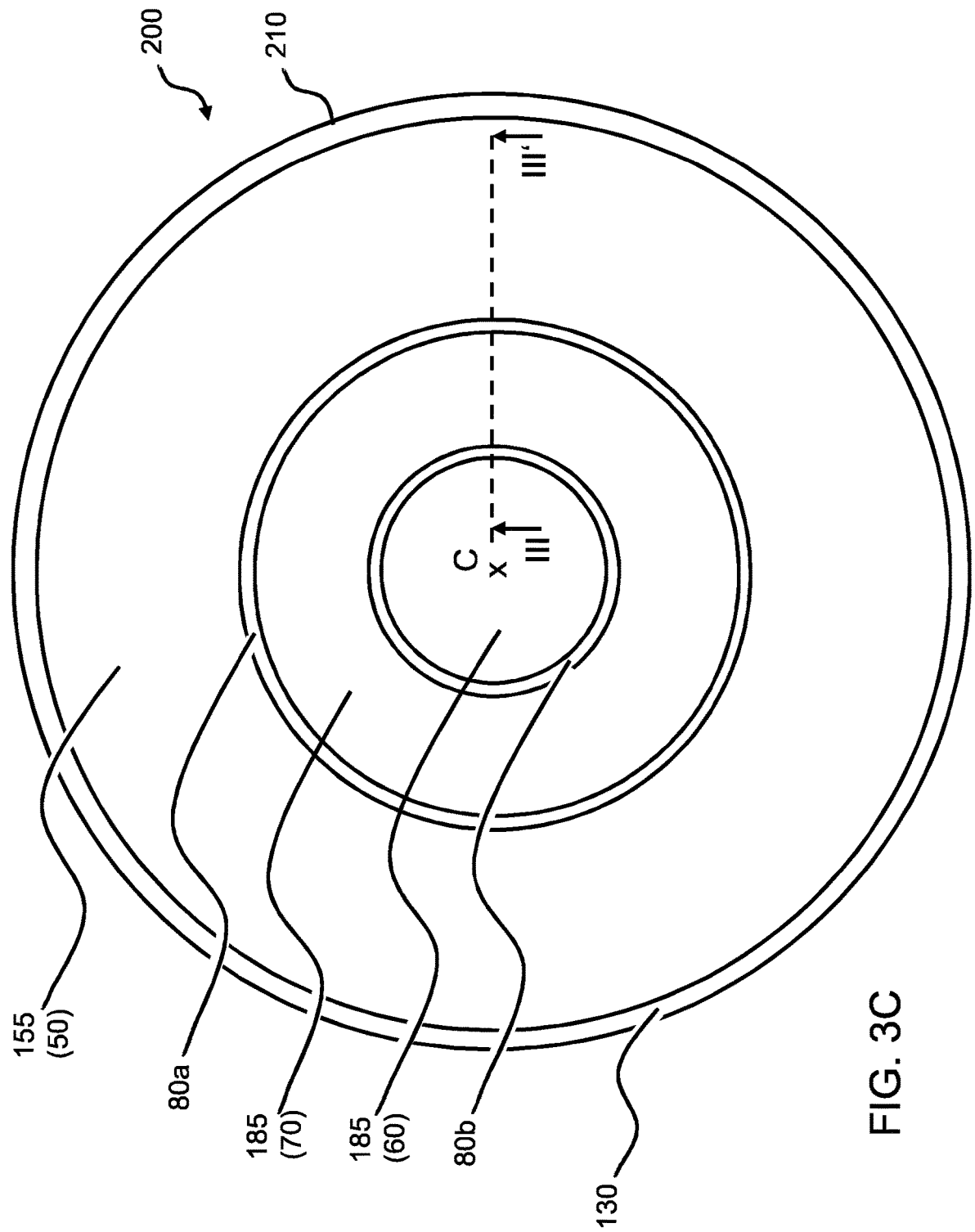
FIG. 3C shows a horizontal cross-section of the power semiconductor device according to the second embodiment.

In the following a power semiconductor device 200 according to a second embodiment will be described with reference to FIGS. 3A to 3C. FIG. 3A illustrates the power semiconductor device 100 in vertical cross-section along a line II-II' in FIG. 3B, which shows the power semiconductor 100 in top view, and along a line III-III' in FIG. 2C, which shows a horizontal cross-section of the power semiconductor device 100 along a line I-I' in FIG. 3A. Due to many similarities between the power semiconductor device 100 according to the first embodiment and the power semiconductor device 200 according to the second embodiment, a description of the power semiconductor device 200 will focus on differences whereas it is referred to the above description of the first embodiment with regard to all remaining features. In particular, elements having the same reference signs in the FIGS. 2A-2C and FIGS. 3A to 3C shall have the same features if not indicated otherwise.

The power semiconductor device 200 according to the second embodiment differs from the power semiconductor device 100 according to the first embodiment in that it comprises in a semiconductor wafer 210 having a first main side 211 and a second main side 212 in addition to the thyristor structure 50 and the BJT 60 a freewheeling diode structure 90 integrated in the semiconductor wafer 210. The freewheeling diode structure 90 comprises in an order from the first main side 211 to the second main side a p-type first diode layer 191, an n-type diode drift layer portion 156c, an n-type diode buffer layer portion 157c and an n-type diode cathode layer 192a. The n-type diode drift layer portion 156c, the n-type diode buffer layer portion 157c and the n-type diode cathode layer 192a form an n-type second diode layer. A p-n junction is formed between the n-type drift layer portion 156c and the first diode layer 191, i.e.

between the first diode layer 191 and the second diode layer 192. In top view the freewheeling diode structure 90 is ring-shaped and arranged laterally between the thyristor structure 50 and the BJT 60.

While in the first embodiment a separation region 80 is arranged between the thyristor structure 50 and the BJT 60, in the second embodiment a first separation region 80a is laterally interposed between the freewheeling diode structure 90 and the thyristor structure 50, and a second separation region 80b is laterally interposed between the freewheeling diode structure 90 and the BJT 60. Both, the first separation region 80a and the second separation region 80b separate the thyristor structure 50 from the BJT 60. Each of the first separation region 80a and the second separation region 80b may have a similar structure as the separation region 80 in the first embodiment. Each one of the first separation region 80a and the second separation region 80b is a separation region as defined in the claims.

In the second embodiment the drift layer 156 and the buffer layer 157 extend laterally through the whole semiconductor wafer 210 as in the first embodiment. Also similar to the first embodiment the thyristor drift layer portion 156a is a first portion of the drift layer 156 and the transistor drift layer portion 156b is a second portion of the drift layer 156. In addition, the diode drift layer portion 156c is a third portion of the drift layer 156, and the first separation region 80a and the second separation region Bob include a fourth and fifth portion of the drift layer 156, respectively. As in the first embodiment the thyristor buffer layer portion 157a is a first portion of the buffer layer 157, and the transistor buffer layer portion 157b is a second portion of the buffer layer 157. In addition the diode buffer layer portion 157c is a third portion of the buffer layer 157, and the first separation region 80a and the second separation region 80b include a fourth and fifth portion of the buffer layer 157, respectively.

Figure 4:
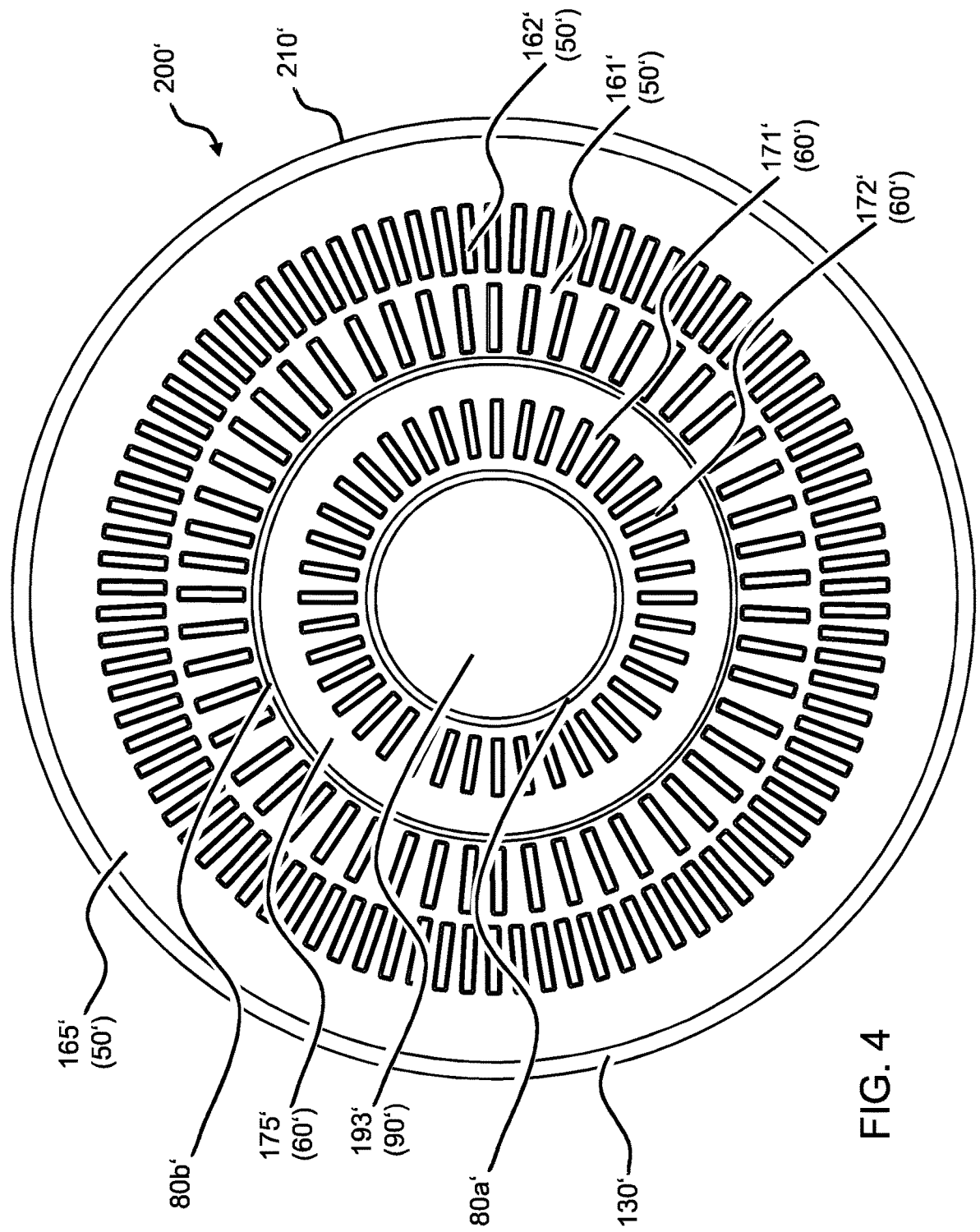
FIG. 4 shows a top view of a power semiconductor device according to a third embodiment.

In the following a power semiconductor device 200' according to a third embodiment is described with reference to FIG. 4, which shows a top view of the power semiconductor device 200'. Due to many similarities between the power semiconductor device 200 according to the second embodiment and the power semiconductor device 200' according to the third embodiment, a description of the power semiconductor device 200' will focus on differences, whereas it is referred to the above description of the second embodiment with regard to all remaining features. In particular, elements having reference signs with the same reference numerals in FIGS. 3A to 3C and FIG. 4 shall have the same features and characteristics if not indicated otherwise.

The power semiconductor device 200' differs from power semiconductor device 200 only in a different arrangement of the freewheeling diode structure 90' relative to the thyristor structure 50' and the BJT 60' in a semiconductor wafer 210'. In cross-section the thyristor structure 50', the BJT 60' and the freewheeling diode structure 90' look respectively the same as the thyristor structure 50, the BJT 60 and the freewheeling diode structure 90 in the second embodiment described above. While in the second embodiment the freewheeling diode structure 90 is arranged laterally between the outer thyristor structure 50' and the central BJT 60', the freewheeling diode 90' in the power semiconductor device 200' is arranged in the lateral center region of the semiconductor wafer 210', and the BJT 60' is laterally arranged between the thyristor structure 50' adjacent to an circumferential edge region 130' of the semiconductor wafer 210' and the central freewheeling diode structure 90'.

Also while in the second embodiment the second common gate contact area 165 is laterally arranged in a central region of the BJT 60, in the third embodiment a second common gate contact area 165' is laterally arranged at an outer circumferential edge of the BJT 60'. A first separation region 80a' is interposed between the central freewheeling diode structure 90' and the BJT 60', and a second separation region 80b' is interposed between the BJT 60 and the outer thyristor structure 50'. The first separation region 80a' and the second separation region 80b' have in cross-section the same structure than the first separation region 80a and the second separation region 80b in the second embodiment but are interposed between different entities. The second separation region 80b' is a separation region as defined in the claims.

Figure 5:
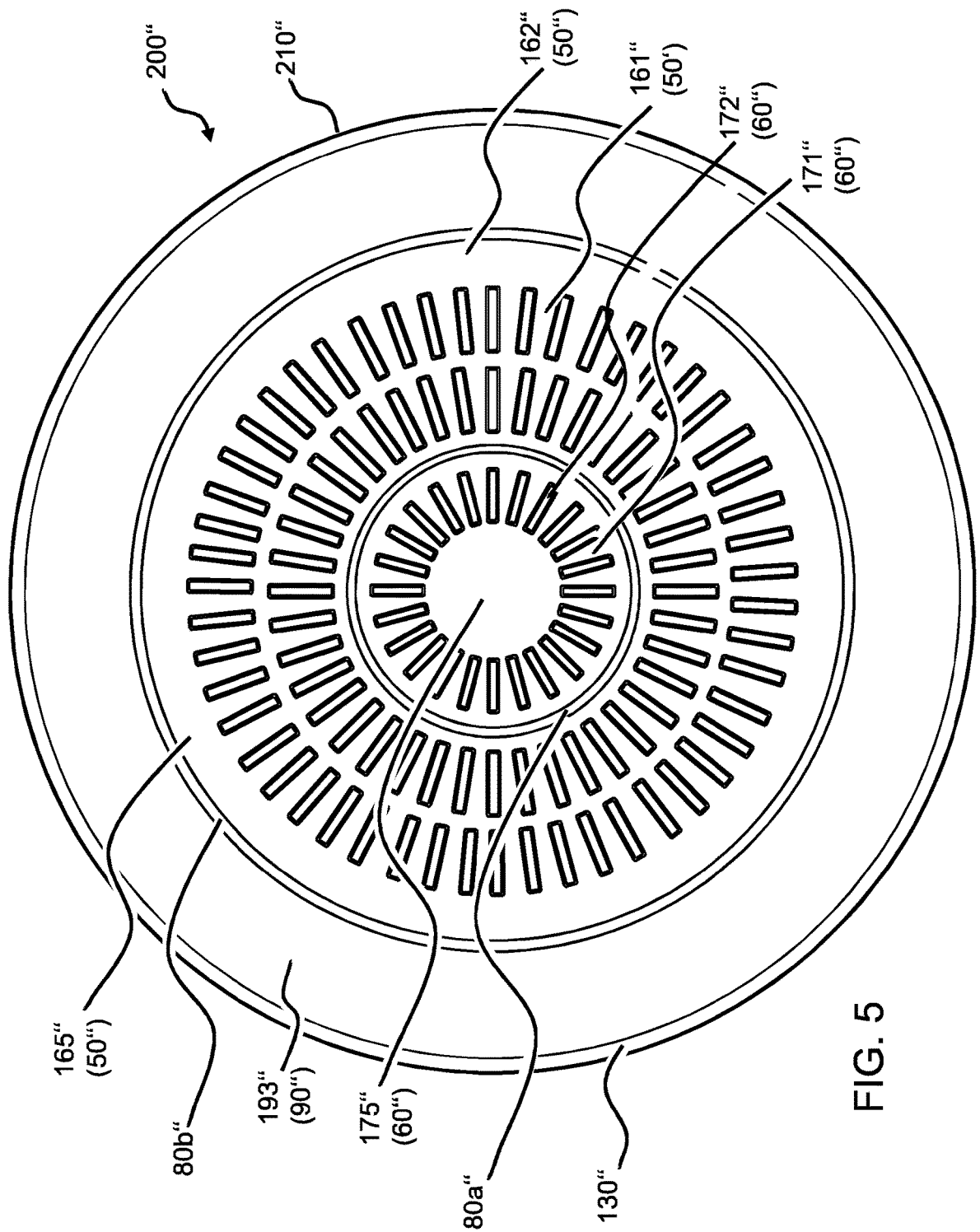
FIG. 5 shows a top view of a power semiconductor device according to the fourth embodiment.

In the following a power semiconductor device 200" according to a fourth embodiment is described with reference to FIG. 5, which shows a top view of the power semiconductor device 200". Due to many similarities between the power semiconductor device 200 according to the second embodiment and the power semiconductor device 200" according to the fourth embodiment, a description of the power semiconductor device 200" will focus on differences, whereas it is referred to the above description of the second embodiment with regard to all remaining features. In particular, elements having reference signs with the same reference numerals in FIGS. 3A to 3C and FIG. 5 shall have the same features and characteristics if not indicated otherwise.

The power semiconductor device 200" differs from power semiconductor device 200 only in a different arrangement of the freewheeling diode structure 90" relative to the thyristor structure 50" and the BJT 60" in a semiconductor wafer 210". In cross-section the thyristor structure 50", the BJT 60" and the freewheeling diode structure 90" look respectively substantially the same as the thyristor structure 50, the BJT 60 and the freewheeling diode structure 90 in the second embodiment described above. While in the second embodiment the freewheeling diode structure 90 is arranged laterally between the outer thyristor structure 50 and the central BJT 60, the freewheeling diode 90' in the power semiconductor device 200' is arranged adjacent to the circumferential edge region 130" of the semiconductor wafer 210" to surround both the BJT 60" and the thyristor structure 50". The BJT 60" is laterally arranged between the outer freewheeling diode structure 90" and the thyristor structure 50" in the lateral center region of the semiconductor wafer 210". A first separation region 80a" is laterally interposed between the central BJT 60" and the thyristor structure 50", and a second separation region 80b" is laterally interposed between the thyristor structure 50" and the freewheeling diode structure 90". The first separation region 80a" and the second separation region 80b" have in cross-section the same structure than the first separation region Boa and the second separation region Bob in the second embodiment but are interposed between different entities. The first separation region 80a" is a separation region as defined in the claims.

Figure 6A:
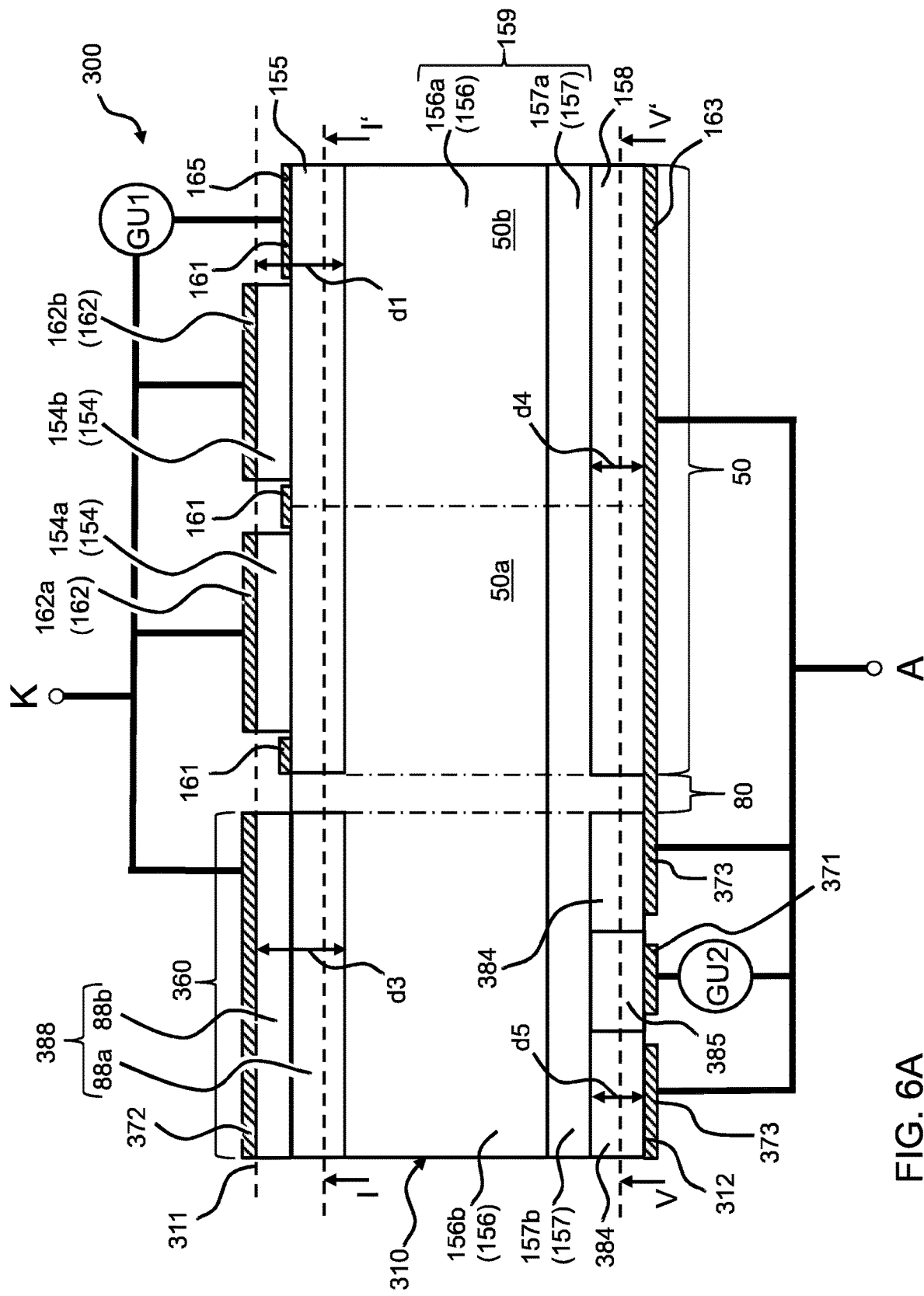
FIG. 6A illustrates a power semiconductor device according to a fifth embodiment in vertical cross-section.
Figure 6B:
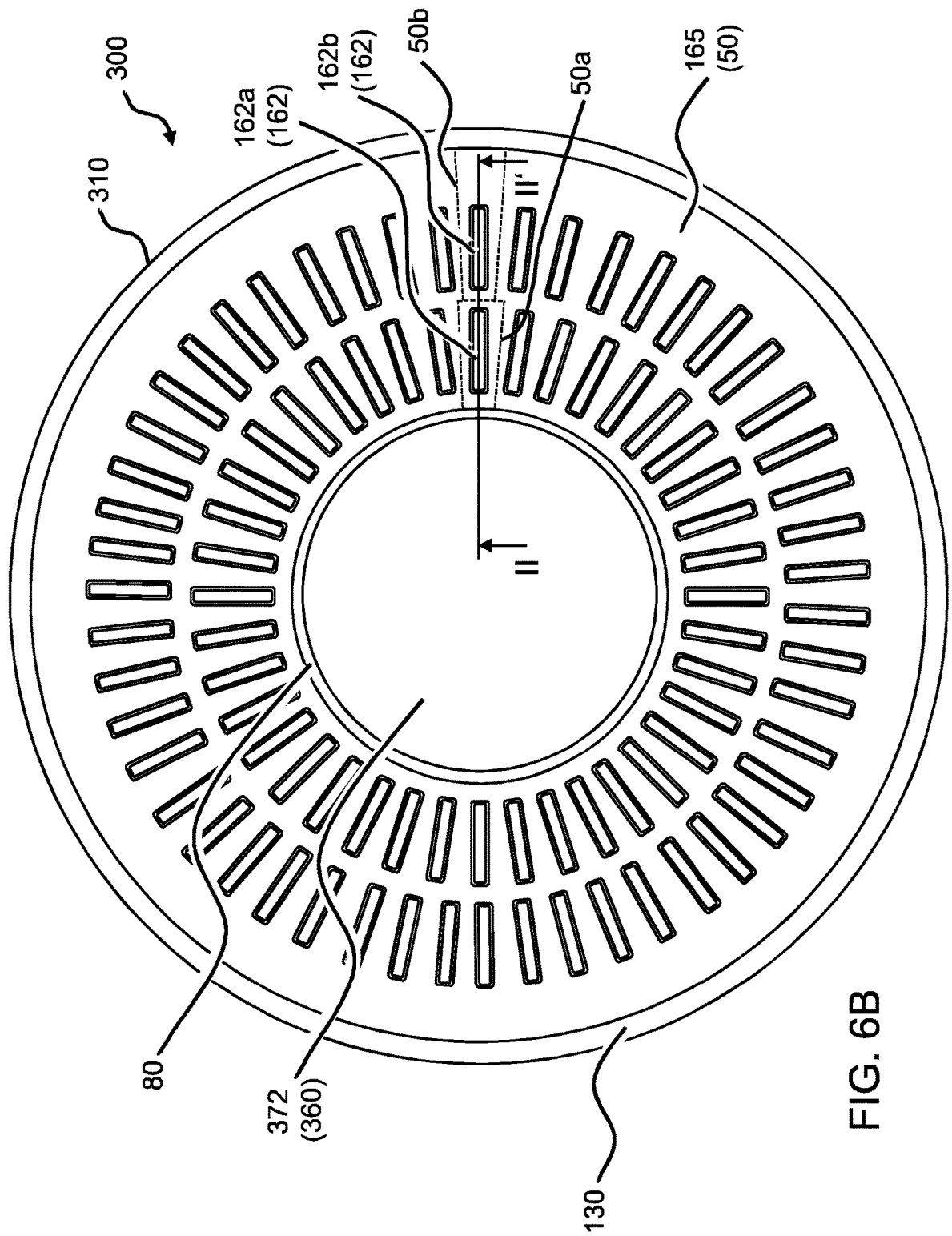
FIG. 6B shows a top view of the power semiconductor device according to the fifth embodiment.
Figure 6C:
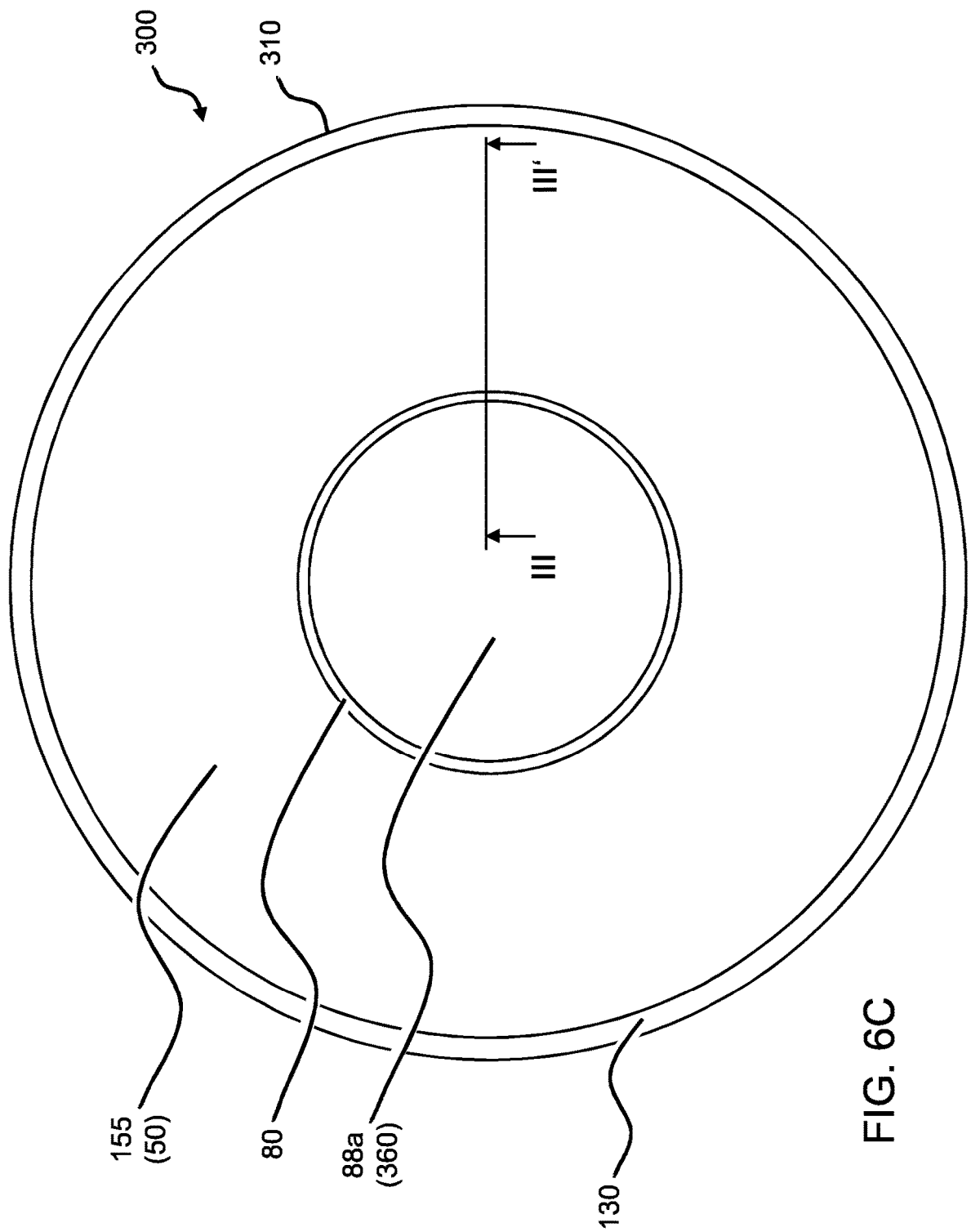
FIG. 6C shows a horizontal cross-section of the power semiconductor device according to the fifth embodiment.
Figure 6D:
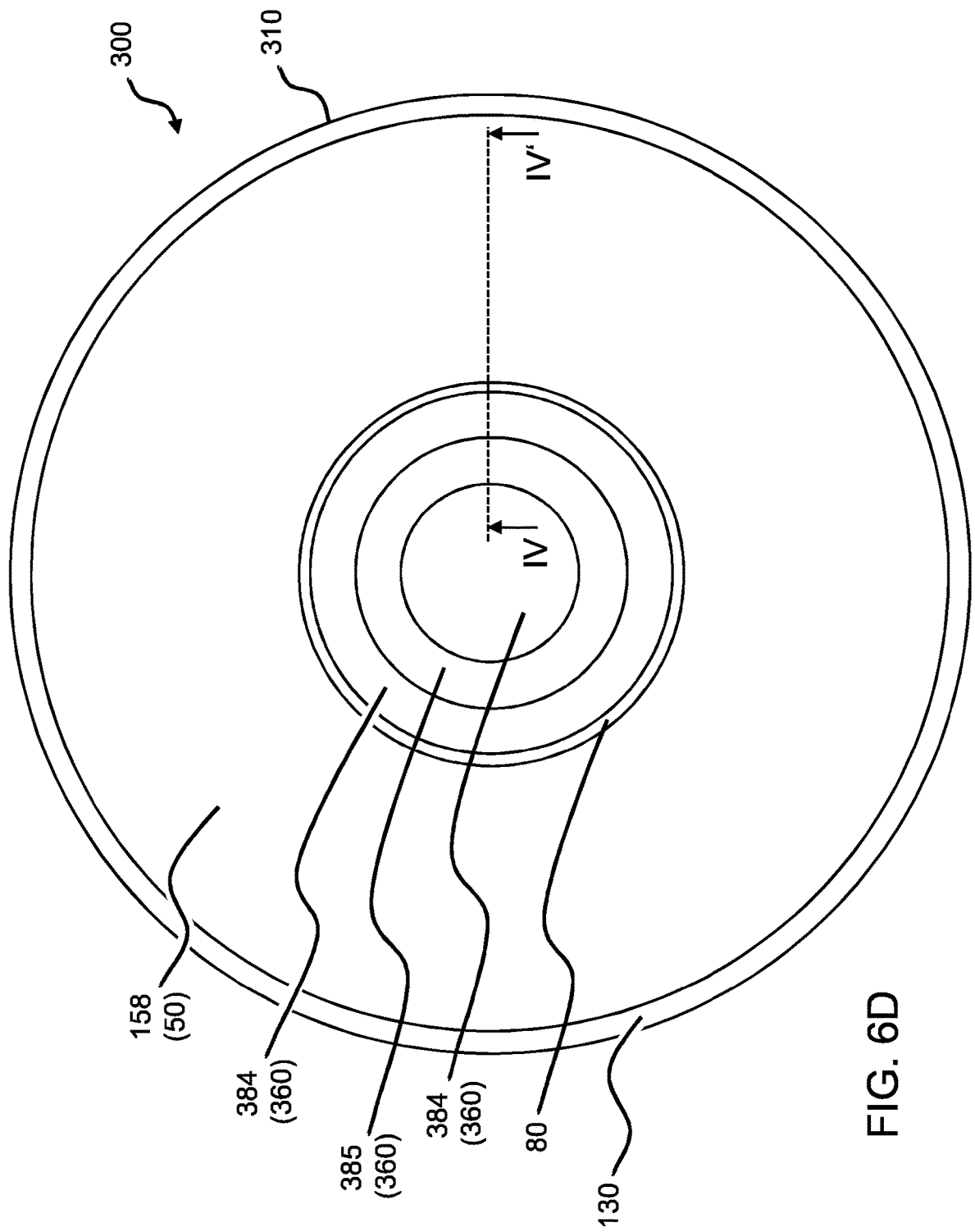
FIG. 6D shows another horizontal cross-section of the power semiconductor device according to the fifth embodiment.

In the following a power semiconductor device 300 according to a fifth embodiment is described with reference to FIGS. 6A to 6D. FIG. 6A illustrates the power semiconductor device 300 in vertical cross-section along a line II-II' in FIG. 6B, which shows the power semiconductor 300 in top view. The cross-section shown in FIG. 6A is also a cross-section along a line III-III' in FIG. 6C, which shows a horizontal cross-section of the power semiconductor device 100 along a line I-I' in FIG. 6A, and is a cross-section along a line IV-IV' in FIG. 6D, which shows a horizontal cross-section of the power semiconductor device 300 along a line V-V in FIG. 6A. Due to many similarities between the power semiconductor device 100 according to the first embodiment and the power semiconductor device 300 according to the fifth embodiment, a description of the power semiconductor device 300 will focus on differences whereas it is referred to the above description of the first embodiment with regard to all remaining features. In particular, elements having the same reference signs in the FIGS. 2A-2C and FIGS. 6A to 6D shall have the same features and characteristics if not indicated otherwise.

The power semiconductor device 300 comprises a semiconductor wafer 310 having a first main side 311 and a second main side 312. It comprises a thyristor structure 50, a BJT 360 and a separation region 80 laterally interposed between the thyristor structure 50 and the BJT 360. The power semiconductor device 300 differs from the power semiconductor device 100 in that the BJT 360 has a different structure than the BJT 60 in the first embodiment. Like the BJT 60 the BJT 360 comprises a base electrode 371 electrically separated from the gate electrode 171, a third main electrode 372 arranged on the first main side 311 and a fourth main electrode 373 arranged on the second main side 312. The base electrode 371 corresponds to a base terminal of the bipolar junction transistor 360, the third main electrode 372 corresponds to a collector terminal of the bipolar junction transistor 360, and the fourth main electrode 373 corresponds to an emitter terminal of the bipolar junction transistor 360.

The BJT 360 comprises in the semiconductor wafer 310 a p-type collector layer 388 arranged adjacent to the first main side 311, an n-type third base layer 385 arranged adjacent to the second main side 312, a p-type third emitter layer 384 arranged adjacent to the second main side 312 lateral to the third base layer 385, an n-type transistor drift layer portion 156b, and an n-type transistor buffer layer portion 157b. The transistor drift layer portion 156b and the transistor buffer layer portion 157b are both arranged between the collector layer 388 and each one of the third base layer 384 and the third emitter layer 385, wherein the collector layer 388 is connected to the drift layer 156 through a fourth p-n junction, the third base layer 385 is connected to the drift layer 156 through the buffer layer 157, and the third base layer 385 is connected to the third emitter layer through a fifth p-n junction. The third main electrode 372 forms an ohmic contact with the collector layer 388, the fourth main electrode 371 forms an ohmic contact with the third emitter layer 384, and the base electrode 371 is arranged lateral to the fourth main electrode 373 and forms an ohmic contact with the third base layer 385.

The collector layer 188 comprises in an order from the first main side 311 towards the second main side 312 a first collector layer portion 88a and a second collector layer portion 88b, wherein the second collector layer portion 88b has along a vertical direction a similar doping profile than the first base layer 155 along a vertical direction. A depth d1 of the first base layer 155 to which the first base layer 155 extends from the first main side 311 may be the same as a depth d3 of the collector layer 388 to which the second collector layer portion 88b of the collector layer 388 extends from the first main side 311. A depth d4 of the second emitter layer 158 to which the second emitter layer 158 extends from the second main side 312 is the same as a depth d5 of the third emitter layer 384 to which the third emitter layer 384 extends from the second main side 312.

It will be apparent for persons skilled in the art that modifications of the above described embodiment are possible without departing from the idea of the invention as defined by the appended claims.

Different lateral arrangements of the thyristor structure 50, 50', 50", of the BJT 60, 60', 60", 360 and the freewheeling diode 90, 90', 90" have been described. However, other lateral arrangements are possible. Also, the invention is not limited to a specific cell structure of the thyristor structure 50, 50', 50" and of the BJT 60, 60', 60", 360. Moreover, while the freewheeling diode 90, 90', 90" was described with a single continuous first diode layer 291 and a single continuous second diode layer 292, the freewheeling diode may have any other segmented cell structure.

The semiconductor wafer of the power semiconductor device of the invention may be made of silicon (Si) or any other appropriate semiconductor material.

In the above described embodiments the first control unit (GU1) and the second control unit (GU2) may be implemented in one single control unit, which has the functionality of both control units GU1 and GU2.

The above embodiments were explained with specific conductivity types. The conductivity types of the semiconductor layers in the above described embodiments might be switched, so that all layers which were described as p-type layers would be n-type layers and all layers which were described as n-type layers would be p-type layers.

It should be noted that the term "comprising" does not exclude other elements or steps and that the indefinite article "a" or "an" does not exclude the plural. Also elements described in association with different embodiments may be combined.

LIST OF REFERENCE SIGNS 1 reverse conducting IGCT (RC-IGCT)
2 thyristor cell
3 integrated free-wheeling diode
10 wafer
11 first main side
12 second main side
20 gate electrode
21 first cathode electrode
22 cathode semiconductor layer portion
23 base semiconductor layer
24 drift semiconductor layer
25 buffer semiconductor layer
26 first anode semiconductor layer
27 first anode electrode
31 second anode electrode
32 second anode semiconductor layer
33 second cathode semiconductor layer
34 second cathode electrode
50 thyristor structure
50a, 50b thyristor cell
60, 360 bipolar junction transistor (BJT)
60a bipolar junction transistor (BJT) cell
80 separation region
80a, 80a', 80a" first separation region
80b, 80b', 80b" second separation region
88a first collector layer portion
88b second collector layer portion
90, 90'; 90" freewheeling diode
100, 200, 200', 200", 300 power semiconductor device
110, 210, 210'; 210"; 310 semiconductor wafer
111, 211, 311 first main side
112, 212, 312 second main side
130, 130', 130" edge region
154 first emitter layer 154*a*, 154*b* portion of the first emitter layer
155 first base layer
156 drift layer
156*a* thyristor drift layer portion
156*b* transistor drift layer portion
156*c* diode drift layer portion
157 buffer layer
157*a* thyristor buffer layer portion
157*b* transistor buffer layer portion
157*c* diode buffer layer portion
158 second emitter layer
159 second base layer
161, 161', 161" gate electrode
162, 162', 162" first main electrode
162*a*, 162*b* portion of the first main electrode
163 second main electrode
165, 165', 165" first common gate contact area
171, 171', 171", 371 base electrode
172, 172', 172", 372 third main electrode
172*a* strip-shaped portion of the third main electrode
173, 373 fourth main electrode
175, 175', 175" second common gate contact area
184, 384 third emitter layer
185, 385 third base layer
188, 388 collector layer
191 first diode layer
192 second diode layer
192*a* diode cathode layer
193 diode anode electrode
194 diode cathode electrode
d1, d2, d3, d4, d5 depth

The invention claimed is:

1. A power semiconductor device comprising:
a semiconductor wafer having a first main side and a second main side opposite to the first main side;
a thyristor structure comprising:
 a first emitter layer of a first conductivity type adjacent the first main side;
 a first base layer of a second conductivity type different from the first conductivity type, wherein the first emitter layer is in direct contact with the first base layer to form a first p-n junction between the first base layer and the first emitter layer;
 a second base layer of the first conductivity type, wherein the first base layer is in direct contact with the second base layer to form a second p-n junction between the first base layer and the second base layer;
 a second emitter layer of the second conductivity type separated from the first base layer by the second base layer, wherein the second base layer is in direct contact with the second emitter layer to form a third p-n junction between the second base layer and the second emitter layer;
 a gate electrode forming an ohmic contact with the first base layer;
 a first main electrode arranged on the first main side and forming an ohmic contact with the first emitter layer; and
 a second main electrode arranged on the second main side and forming an ohmic contact with the second emitter layer; and
a bipolar junction transistor arranged lateral to the thyristor structure, wherein the bipolar junction transistor comprises a base electrode electrically separated from the gate electrode, a third main electrode arranged on the first main side and a fourth main electrode arranged on the second main side, wherein the first main electrode is electrically connected to the third main electrode and the second main electrode is electrically connected to the fourth main electrode;
wherein the base electrode corresponds to a base terminal of the bipolar junction transistor;
wherein the third main electrode corresponds to one of a collector terminal and an emitter terminal of the bipolar junction transistor; and
wherein the fourth main electrode corresponds to the other one of the collector terminal and the emitter terminal of the bipolar junction transistor.

2. The power semiconductor device according to claim 1, wherein the semiconductor wafer comprises a separation region of the first conductivity type, wherein the separation region is arranged laterally between the bipolar junction transistor and the thyristor structure.

3. The power semiconductor device according to claim 1, wherein the semiconductor wafer comprises a freewheeling diode arranged lateral to the thyristor structure and arranged lateral to the bipolar junction transistor, the freewheeling diode comprising a first diode layer of the second conductivity type and a second diode layer of the first conductivity type forming a fourth p-n junction with the first diode layer.

4. The power semiconductor device according to claim 1, wherein the second base layer comprises a thyristor drift layer portion and a thyristor buffer layer portion having a doping concentration higher than that of the thyristor drift layer portion, wherein the thyristor buffer layer portion separates the thyristor drift layer portion from the second emitter layer.

5. The power semiconductor device according to claim 1, wherein the thyristor structure comprises a gate commutated thyristor device comprising a plurality of thyristor cells.

6. The power semiconductor device according to claim 1, wherein the bipolar junction transistor comprises in an order from the first main side to the second main side:
a third emitter layer of the first conductivity type;
a third base layer of the second conductivity type which is connected to the third emitter layer through a fourth p-n junction;
a transistor drift layer portion of the first conductivity type which is connected to the third base layer through a fifth p-n junction; and
a collector layer of the first conductivity type which has a higher doping concentration than the transistor drift layer portion and is either in direct contact with the transistor drift layer portion or connected to the transistor drift layer portion by a transistor buffer layer portion of the first conductivity type, the transistor buffer layer portion having a doping concentration higher than that of the transistor drift layer portion;
wherein the third main electrode forms an ohmic contact with the third emitter layer;
wherein the fourth main electrode forms an ohmic contact with the collector layer; and
wherein the base electrode is arranged lateral to the third emitter layer and forms an ohmic contact with the third base layer.

7. The power semiconductor device according to claim 6, wherein a depth of the first base layer to which the first base layer extends from the first main side is the same as a depth of the third base layer to which the third base layer extends from the first main side.

8. The power semiconductor device according to claim 7, wherein the first base layer has, at a first lateral position at which a lateral gradient of a doping concentration of the first base layer is zero for all vertical positions, the same vertical doping concentration profile as the third base layer at a second lateral position at which a lateral gradient of a doping concentration of the third base layer is zero for all vertical positions.

9. The power semiconductor device according to claim 6, wherein a ratio between a bipolar junction transistor area and a thyristor area is in a range between 0.1 and 0.3, wherein the thyristor area is defined as an area occupied by the first base layer of the thyristor structure in a horizontal projection onto a plane parallel to the second main side and wherein the bipolar junction transistor area is defined as an area occupied by the third base layer in the horizontal projection onto the plane parallel to the second main side.

10. The power semiconductor device according to claim 9, wherein the ratio between the bipolar junction transistor area and the thyristor area is in a range between 0.15 and 0.25.

11. The power semiconductor device according to claim 1, wherein the bipolar junction transistor comprises:
a collector layer of the second conductivity type arranged adjacent to the first main side;
a third base layer of the first conductivity type arranged adjacent to the second main side;
a third emitter layer of the second conductivity type arranged adjacent to the second main side lateral to the third base layer; and
a transistor drift layer portion arranged between the collector layer and each one of the third base layer and the third emitter layer;
wherein the collector layer is connected to the transistor drift layer portion through a fourth p-n junction;
wherein the third base layer is either in direct contact with the transistor drift layer portion or is connected to the transistor drift layer portion through a transistor buffer layer portion of the first conductivity type, the transistor buffer layer portion having a doping concentration higher than that of the transistor drift layer portion;
wherein the third base layer is connected to the third emitter layer through a fifth p-n junction;
wherein the third main electrode forms an ohmic contact with the collector layer;
wherein the fourth main electrode forms an ohmic contact with the third emitter layer; and
wherein the base electrode is arranged lateral to the fourth main electrode and forms an ohmic contact with the third base layer.

12. The power semiconductor device according to claim 11, wherein a depth of the first base layer to which the first base layer extends from the first main side is the same as a depth of the collector layer to which the collector layer extends from the first main side.

13. The power semiconductor device according to claim 11, wherein a depth of the second emitter layer to which the second emitter layer extends from the second main side is the same as a depth of the third emitter layer to which the third emitter layer extends from the second main side.

14. A power semiconductor device comprising:
a semiconductor wafer having a first main side and a second main side opposite to the first main side;
a thyristor structure comprising:
a first emitter layer of a first conductivity type adjacent the first main side;
a first base layer of a second conductivity type different from the first conductivity type, wherein the first emitter layer is in direct contact with the first base layer to form a first p-n junction between the first base layer and the first emitter layer;
a second base layer of the first conductivity type, wherein the first base layer is in direct contact with the second base layer to form a second p-n junction between the first base layer and the second base layer;
a second emitter layer of the second conductivity type separated from the first base layer by the second base layer, wherein the second base layer is in direct contact with the second emitter layer to form a third p-n junction between the second base layer and the second emitter layer;
a gate electrode forming an ohmic contact with the first base layer;
a first main electrode arranged on the first main side and forming an ohmic contact with the first emitter layer; and
a second main electrode arranged on the second main side and forming an ohmic contact with the second emitter layer; and
a bipolar junction transistor arranged lateral to the thyristor structure, wherein the bipolar junction transistor comprises a base electrode electrically separated from the gate electrode, a third main electrode arranged on the first main side and a fourth main electrode arranged on the second main side, wherein the first main electrode is electrically connected to the third main electrode and the second main electrode is electrically connected to the fourth main electrode;
wherein the base electrode corresponds to a base terminal of the bipolar junction transistor;
wherein the third main electrode corresponds to one of a collector terminal and an emitter terminal of the bipolar junction transistor;
wherein the fourth main electrode corresponds to the other one of the collector terminal and the emitter terminal of the bipolar junction transistor;
wherein the thyristor structure comprises a gate commutated thyristor device comprising a plurality of thyristor cells; and
wherein each thyristor cell comprises:
a portion of the first emitter layer;
a portion of the first base layer, wherein the portion of the first emitter layer is in direct contact with the portion of the first base layer to form a portion of the first p-n junction between the first base layer and the first emitter layer;
a portion of the second base layer, wherein the portion of the first base layer is in direct contact with the portion of the second base layer to form a portion of the second p-n junction between the first base layer and the second base layer; and
a portion of the second emitter layer separated from the portion of the first base layer by the second base layer, wherein the portion of the second base layer is in direct contact with the portion of the second emitter layer to form a portion of the third p-n junction between the second base layer and the second emitter layer.

15. The power semiconductor device according to claim 14, wherein the thyristor structure further comprises:
a portion of the gate electrode which is arranged lateral to the portion of the first emitter layer and forms an ohmic contact with the portion of the first base layer;
a portion of the first main electrode which forms an ohmic contact with the portion of the first emitter layer; and a portion of the second main electrode which forms an ohmic contact with the portion of the second emitter layer, wherein the portion of the first emitter layer of each thyristor cell is laterally separated from the portion of the first emitter layer of each other thyristor cell.

16. A power semiconductor device comprising:
a semiconductor wafer having a first main side and a second main side opposite to the first main side;
a thyristor structure comprising:
   a first emitter layer of a first conductivity type adjacent the first main side;
   a first base layer of a second conductivity type different from the first conductivity type, wherein the first emitter layer is in direct contact with the first base layer to form a first p-n junction between the first base layer and the first emitter layer;
   a second base layer of the first conductivity type, wherein the first base layer is in direct contact with the second base layer to form a second p-n junction between the first base layer and the second base layer;
   a second emitter layer of the second conductivity type separated from the first base layer by the second base layer, wherein the second base layer is in direct contact with the second emitter layer to form a third p-n junction between the second base layer and the second emitter layer;
   a gate electrode forming an ohmic contact with the first base layer;
   a first main electrode arranged on the first main side and forming an ohmic contact with the first emitter layer; and
   a second main electrode arranged on the second main side and forming an ohmic contact with the second emitter layer;
a bipolar junction transistor arranged lateral to the thyristor structure, wherein the bipolar junction transistor comprises a base electrode electrically separated from the gate electrode, a third main electrode arranged on the first main side and a fourth main electrode arranged on the second main side, wherein the first main electrode is electrically connected to the third main electrode and the second main electrode is electrically connected to the fourth main electrode;

a first control unit electrically connected to the gate electrode and configured to control a voltage and/or current applied to the gate electrode; and
a second control unit electrically configured to control a current and/or voltage applied to the base electrode;
wherein the base electrode corresponds to a base terminal of the bipolar junction transistor; and
wherein the third main electrode corresponds to one of a collector terminal and an emitter terminal of the bipolar junction transistor, and the fourth main electrode corresponds to the other one of the collector terminal and the emitter terminal of the bipolar junction transistor.

17. The power semiconductor device according to claim 14, wherein the semiconductor wafer comprises a separation region of the first conductivity type, wherein the separation region is arranged laterally between the bipolar junction transistor and the thyristor structure.

18. The power semiconductor device according to claim 14, wherein the semiconductor wafer comprises a freewheeling diode arranged lateral to the thyristor structure and arranged lateral to the bipolar junction transistor, the freewheeling diode comprising a first diode layer of the second conductivity type and a second diode layer of the first conductivity type forming a fourth p-n junction with the first diode layer.

19. The power semiconductor device according to claim 14, wherein the second base layer comprises a thyristor drift layer portion and a thyristor buffer layer portion having a doping concentration higher than that of the thyristor drift layer portion, wherein the thyristor buffer layer portion separates the thyristor drift layer portion from the second emitter layer.

20. The power semiconductor device according to claim 16, wherein the first control unit and the second control unit are configured to first turn on the bipolar junction transistor in a state in which the thyristor structure is in a forward blocking state, to thereafter turn on the thyristor structure from the forward blocking state into a forward conducting state, and to thereafter turn off the bipolar junction transistor while maintaining the thyristor structure in the forward conducting state.

* * * * *